US012695063B2

(12) United States Patent
Katsunuma et al.

(10) Patent No.: US 12,695,063 B2
(45) Date of Patent: Jul. 28, 2026

(54) PLASMA PROCESSING METHOD AND PLASMA PROCESSING APPARATUS

(71) Applicant: Tokyo Electron Limited, Tokyo (JP)

(72) Inventors: Takayuki Katsunuma, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 39 days.

(21) Appl. No.: 18/757,613

(22) Filed: Jun. 28, 2024

(65) Prior Publication Data

US 2024/0355590 A1      Oct. 24, 2024

Related U.S. Application Data

(63) Continuation of application No. PCT/JP2022/047973, filed on Dec. 26, 2022.

(30) Foreign Application Priority Data

Dec. 28, 2021    (JP) ................................. 2021-213733
Sep. 2, 2022    (JP) ................................. 2022-139914

(51) Int. Cl.
*H01J 37/32*          (2006.01)

(52) U.S. Cl.
CPC . *H01J 37/32449* (2013.01); *H01J 2237/3321* (2013.01); *H01J 2237/3346* (2013.01)

(58) Field of Classification Search
CPC ....... C23C 16/045; C23C 16/20; C23C 16/06; C23C 16/22; C23C 16/042; C23C 16/047;
C23C 16/50; C23C 16/503; C23C 16/505; C23C 16/515; C23C 16/345; H01J 37/32449; H01J 2273/3321; H01J 2273/3346
See application file for complete search history.

(56) References Cited

U.S. PATENT DOCUMENTS 6,242,367 B1 *    6/2001    Sun ....................... C23C 16/345
257/E21.293
2020/0279757 A1 *    9/2020    Kumakura .......... H10P 72/0421

FOREIGN PATENT DOCUMENTS

| JP | 2016-021546 A | 2/2016 |
| JP | 2020-088355 A | 6/2020 |
| JP | 2020-119918 A | 8/2020 |
| JP | 2021-118315 A | 8/2021 |

OTHER PUBLICATIONS

International Search Report issued on Mar. 14, 2023 for WO 2023/127817 A1, 4 pages including English Translation.

* cited by examiner

*Primary Examiner* — Michael P Wieczorek
(74) *Attorney, Agent, or Firm* — XSENSUS LLP

(57) ABSTRACT

A substrate processing method includes preparing a substrate. The substrate includes a first region and a second region providing an opening on the first region. The substrate processing method further includes forming a top deposit on a top of the second region by using a first plasma generated from a first gas. The substrate processing method further includes forming a first film on a surface of the top deposit and a sidewall surface defining the opening, the first film having a thickness decreasing along a depth direction of the opening.

12 Claims, 19 Drawing Sheets

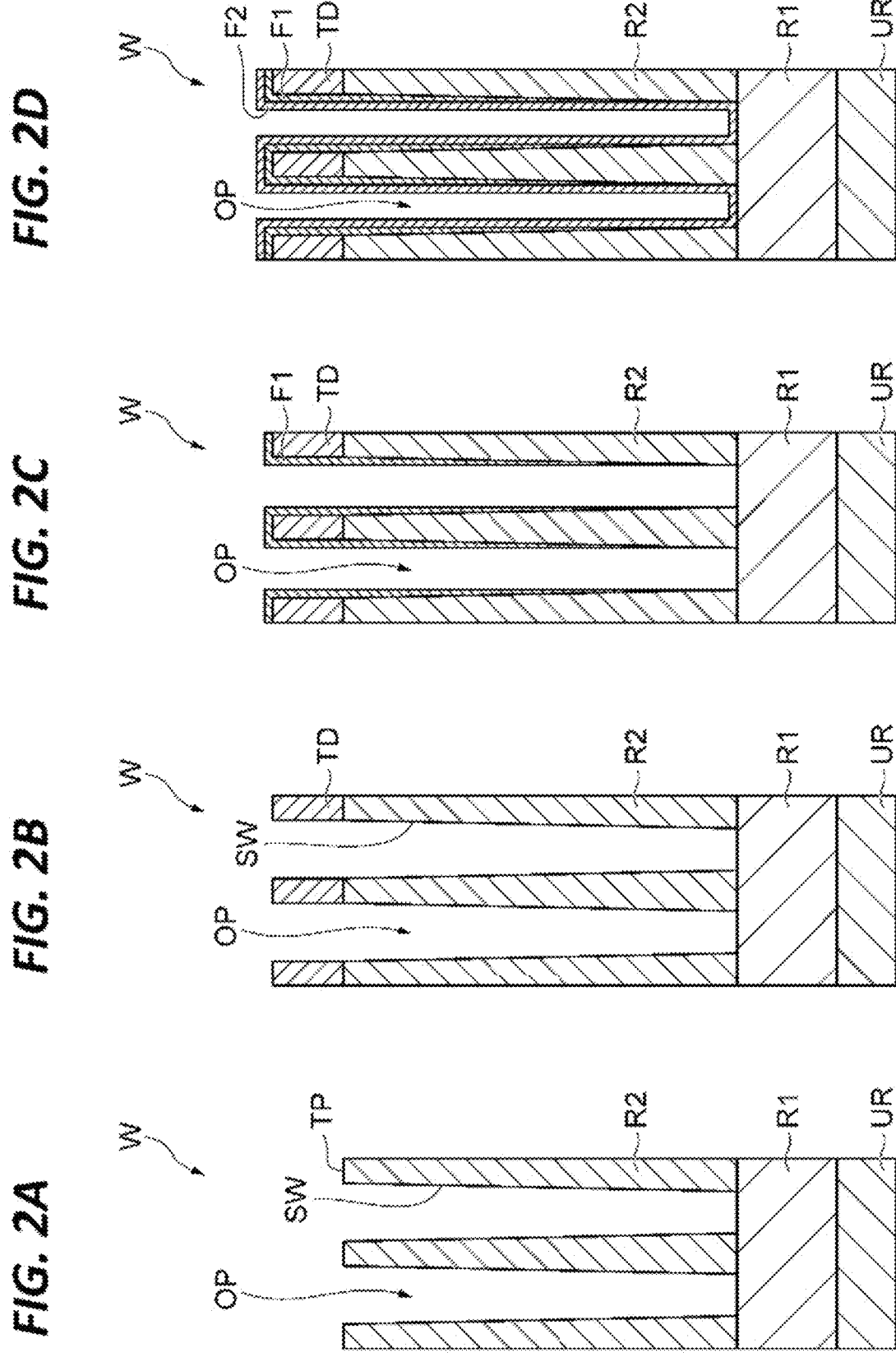
*FIG. 2A* *FIG. 2B* *FIG. 2C* *FIG. 2D*

MT1

FIG. 10
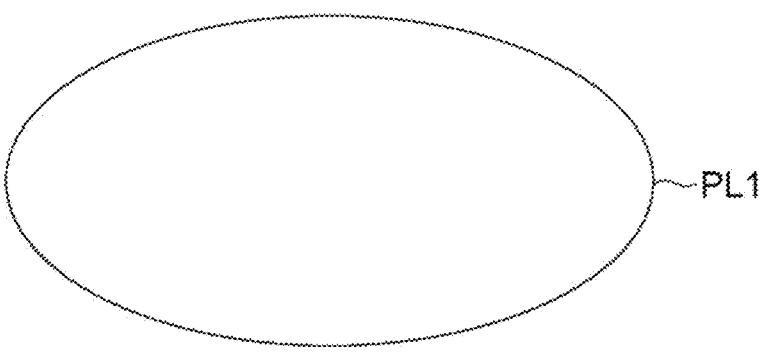
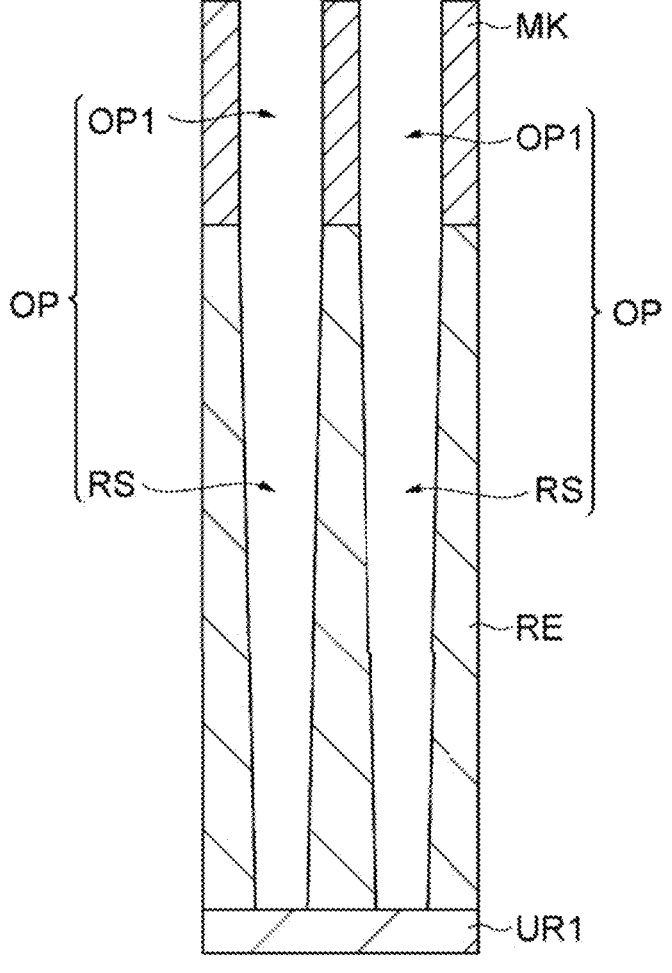

*FIG. 11*
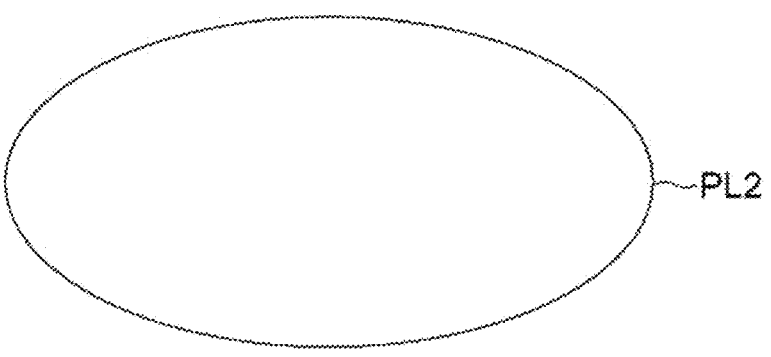
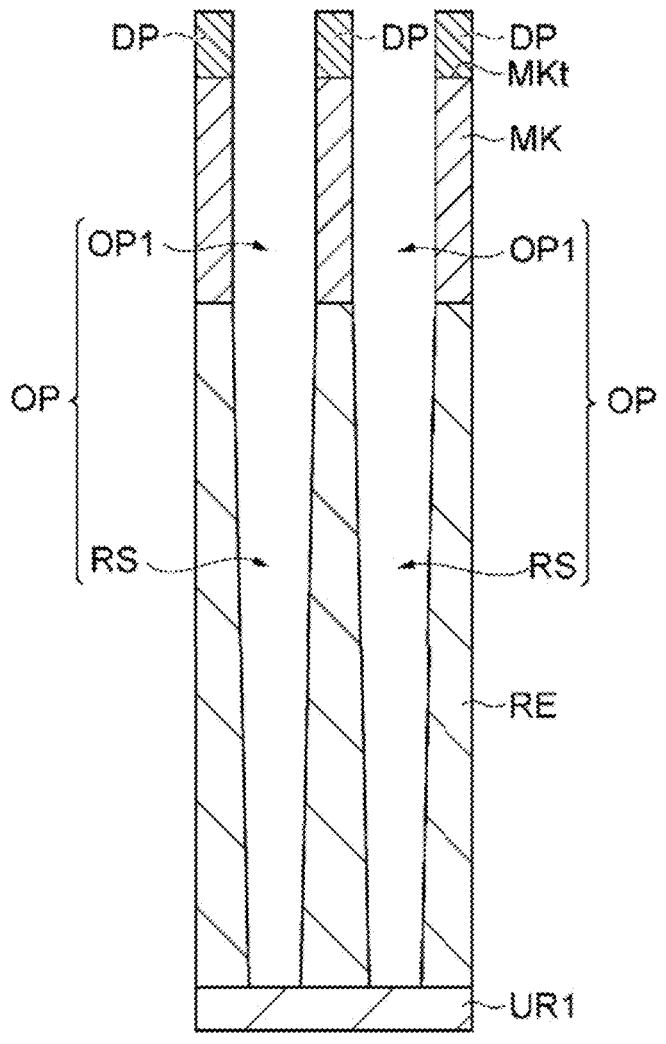

PLASMA PROCESSING METHOD AND PLASMA PROCESSING APPARATUS

CROSS-REFERENCE TO RELATED APPLICATIONS

This application is a continuation application of International Patent Application No. PCT/JP2022/047973, filed on Dec. 26, 2022, which claims priority from Japanese Patent Application Nos. 2021-213733 and 2022-139914, filed on Dec. 28, 2021 and Sep. 2, 2022, respectively, with the Japan Patent Office, all of which are incorporated herein in their entireties by reference.

TECHNICAL FIELD

The present disclosure relates to a plasma processing method and a plasma processing apparatus.

BACKGROUND

In substrate processing, the shape of a mask may be adjusted. Japanese Patent Laid-Open Publication No. 2020-088355 discloses a technique, which forms a film on a mask, followed by forming a reactive layer on the surface of a substrate, and then, removes the reactive layer.

Japanese Patent Laid-Open Publication No. 2016-021546 discloses a method of etching a silicon-containing film by plasma generated from a gas containing carbon fluoride. In this method, the silicon-containing film is first etched to the middle of the film. Then, a carbon-containing film is formed on the silicon-containing film without generating plasma. Then, the silicon-containing film on which the carbon-containing film is formed is further etched.

SUMMARY

An embodiment of the present disclosure provides a plasma processing method including (a) preparing a substrate. The substrate includes a first region and a second region formed on the first region and providing an opening on the first region. The substrate processing method further includes (b) forming a top deposit on a top of the second region, by using a plasma generated from a gas. The substrate processing method further includes (c) forming a first film on a surface of the top deposit and a sidewall surface defining the opening, the first film having a thickness decreasing along a depth direction of the opening.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 2A to 2D are each a partially enlarged cross-sectional view of an example of a substrate processed in a corresponding step of the substrate processing method according to an embodiment.

FIG. 10 is a cross-sectional view illustrating one step of the etching method according to an embodiment.

FIG. 11 is a cross-sectional view illustrating one step of the etching method according to an embodiment.

DETAILED DESCRIPTION

Figure 1:
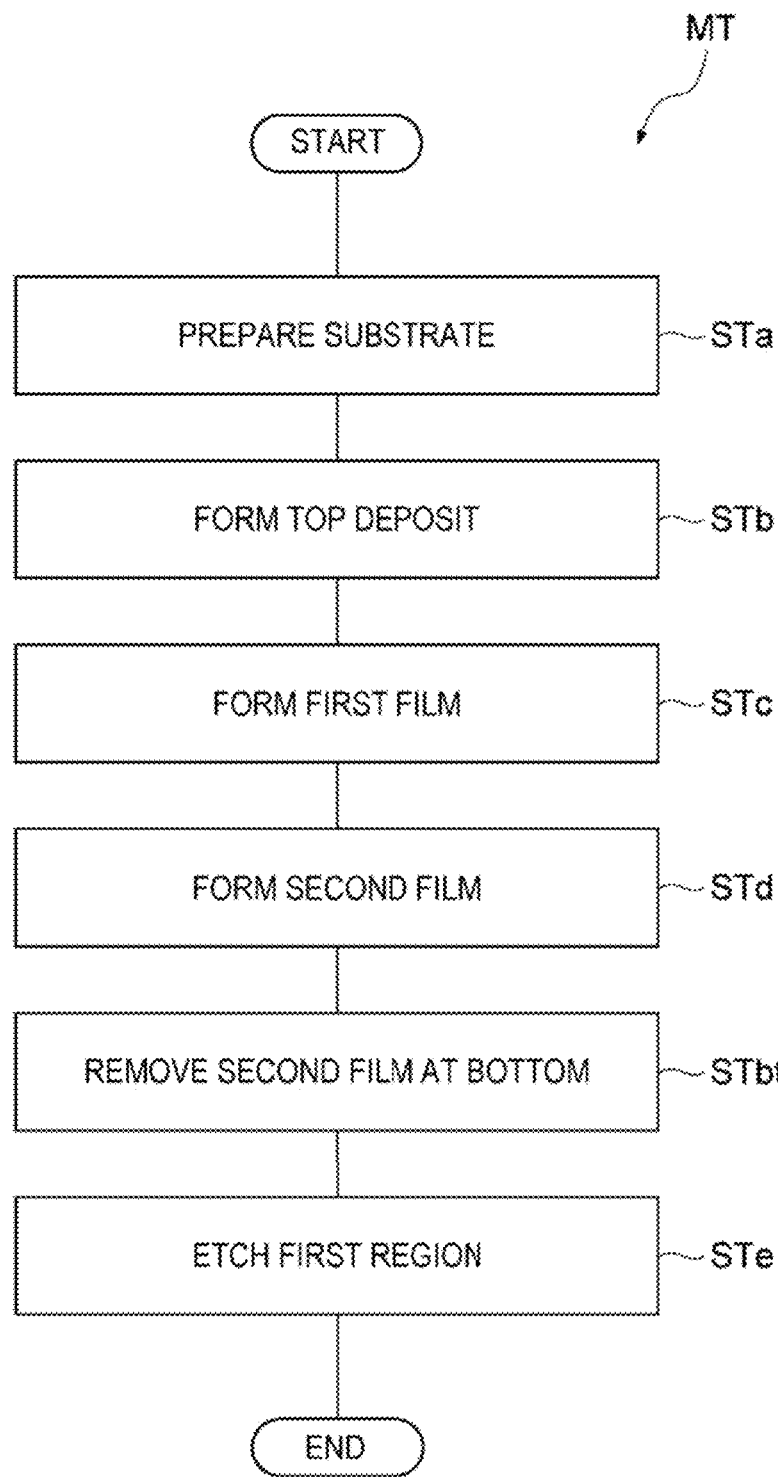
FIG. 1 is a view illustrating a substrate processing method according to an embodiment.

In the following detailed description, reference is made to the accompanying drawings which form a part hereof. The illustrative embodiments described in the detailed description, drawings, and claims are not meant to be limiting. Other embodiments may be utilized, and other changes may be made without departing from the spirit or scope of the subject matter presented herein.

Hereinafter, various embodiments will be described in detail with reference to the drawings. In the respective drawings, identical or corresponding portions will be denoted by the same reference numerals.

FIG. 1 is a view illustrating a substrate processing method according to an embodiment. FIGS. 2A to 2D, 3A, and 3B are each a partially enlarged cross-sectional view of an example of a substrate processed in a corresponding step of a substrate processing method according to an embodiment. The substrate processing method illustrated in FIG. 1 (hereinafter, referred to as a "method MT") includes steps Sta to STc. The method MT may further include step STd. The method MT may further include step Ste. In addition, the method MT may further include step STbt.

In step Sta, a substrate W is prepared. As illustrated in FIG. 2A, the substrate W prepared in step Sta includes a first region R1 and a second region R2. The second region R2 is provided on the first region R1. The second region R2 provides an opening OP on the first region R1. The opening OP is defined by the sidewall surface SW of the second region R2. The width of the opening OP decreases along its depth direction. That is, the sidewall surface SW has an angle inclined with respect to the vertical direction. The first region R1 is exposed at the opening OP. The substrate W may further include an underlying region UR, and the first region R1 may be provided on the underlying region UR.

The second region R2 may serve as a mask when the first region R1 is etched. Thus, the second region R2 is formed of a material having a lower etching rate than that of the first region R1 in etching the first region R1. The first region R1 is a silicon-containing film or an organic film. The silicon-containing film that makes up the first region R1 is, for example, a silicon film, a silicon oxide film, a silicon nitride film, or a stacked film including a silicon oxide film and a silicon nitride film. The organic film that makes up the first region R1 is, for example, an amorphous carbon film. The second region R2 is, for example, a polycrystalline silicon film, an organic film, or a resist film.

In a first example of the substrate W, the first region R1 is a silicon film, and the second region R2 is a silicon oxide film. In a second example of the substrate W, the first region R1 is a silicon oxide film, and the second region R2 is an organic film. In a third example of the substrate W, the first region R1 is an organic film, and the second region R2 is a silicon oxide film.

Step STb is performed after step Sta. In step STb, a top deposit TD is formed on the top TP of the second region R2, by using plasma generated from a deposition processing gas, as illustrated in FIG. 2B. The top deposit TD is formed by, for example, a plasma Chemical Vapor Deposition (CVD) method.

The top deposit TD may be formed of a material having a lower etching rate than the etching rate of the material that makes up the second region R2, in etching the first region R1 during step STe. When the first region R1 is a silicon-containing film as in the first and second examples of the substrate W described above, the top deposit TD contains carbon, boron, or a metal. When the first region R1 is an organic film as in the third example of the substrate W described above, the top deposit TD contains boron or a metal. The metal included in the top deposit TD may include tungsten, tin, or molybdenum.

When the top deposit TD contains carbon, the deposition processing gas may include carbon and may not include fluorine. The deposition processing gas may include, for example, carbon monoxide gas (CO gas), carbonyl sulfide gas (COS gas), or hydrocarbon gas. The hydrocarbon gas is, for example, $C_2H_2$ gas, $C_2H_4$ gas, $CH_4$ gas, or $C_2H_6$ gas. A first processing gas may not include hydrogen. The first processing gas may further include hydrogen gas ($H_2$ gas) as an additive gas. The first processing gas may further include a noble gas such as argon gas or helium gas. The first processing gas may further include an inert gas such as nitrogen gas ($N_2$ gas), in addition to or instead of the noble gas.

When the top deposit TD contains carbon, the deposition processing gas may include a first component gas and a second component gas. The first component gas is a gas that includes carbon and does not include fluorine, and for example, CO gas or COS gas. That is, the deposition processing gas may include a first component that contains carbon and does not contain fluorine. The first component is, for example, carbon monoxide (CO) or carbonyl sulfide. The second component gas is a gas that contains carbon and fluorine or hydrogen, and for example, hydrofluorocarbon gas, fluorocarbon gas, or hydrocarbon gas. That is, the deposition processing gas may further include a second component containing carbon and fluorine or hydrogen. The second component is, for example, hydrofluorocarbon, fluorocarbon, or hydrocarbon. The hydrofluorocarbon gas is, for example, $CHF_3$ gas, $CH_3F$ gas, or $CH_2F_2$ gas. The fluorocarbon gas is, for example, $C_4F_6$ gas. The second component gas containing carbon and hydrogen is, for example, $CH_4$ gas. The flow rate of the first component gas or the first component may be larger than the flow rate of the second component gas or the second component.

When the top deposit TD contains boron, the deposition processing gas may include boron trichloride gas ($BCl_3$ gas). The deposition processing gas may further include a noble gas such as argon gas or helium gas. The deposition processing gas may further include a nitrogen-containing gas such as $N_2$ gas.

When the top deposit TD contains tungsten, the deposition processing gas includes tungsten. The deposition processing gas may further include at least one of carbon and hydrogen. The deposition process gas may further contain fluorine. The deposition processing gas may include at least one of a carbon-containing gas and a hydrogen-containing gas, and a tungsten-containing gas. The fluorine may be included in the carbon-containing gas, the hydrogen-containing gas, or the tungsten-containing gas.

When the top deposit TD contains tungsten, the carbon-containing gas may include at least one of $CH_4$ gas, $C_2H_2$ gas, $C_2H_4$ gas, $CH_3F$ gas, $CH_2F_2$ gas, $CHF_3$, and CO gas. The hydrogen-containing gas may include at least one of $H_2$ gas, $SiH_4$ gas, and $NH_3$ gas. The tungsten-containing gas may include tungsten halide gas. The tungsten halide gas may include at least one of tungsten hexafluoride ($WF_6$) gas, tungsten hexabromide ($WBr_6$) gas, tungsten hexachloride ($WCl_6$) gas, and $WF_5Cl$ gas. The tungsten-containing gas may include hexacarbonyl tungsten ($W(CO)_6$) gas. The deposition processing gas may further include, for example, a noble gas such as argon gas, helium gas, xenon gas, or neon gas. The first processing gas may further include, for example, nitrogen ($N_2$) gas.

The flow ratio of the tungsten-containing gas may be smaller than the flow ratio of at least one of the carbon-containing gas and the hydrogen-containing gas. The flow ratio of the noble gas may be larger than the flow ratio of at least one of the carbon-containing gas and the hydrogen-containing gas. In the present disclosure, the flow ratio of each gas refers to the ratio of the flow rate of each gas to the total flow rate of the processing gas (volume %).

When the top deposit TD contains tin, the deposition processing gas includes the first component gas. The deposition processing gas may further include the second component gas. The first component gas includes a tin-containing substance. The second component gas may include $H_2O$, $H_2O_2$, $O_2$, $O_3$, $N_2O_4$, a nitrogen-containing inorganic compound, a sulfur-containing inorganic compound, a halogen compound, a carbon-containing substance, or a silicon-containing substance. Alternatively, the second component gas may include at least one of $N_2$ and an oxygen-containing substance. The oxygen-containing substance may be NO or $CO_2$.

The tin-containing substance may be, for example, a stannane compound, an oxygen-containing tin compound, a nitrogen-containing tin compound, or a tin halide compound.

The stannane compound is, for example, stannane, tetramethylstannane, tributylstannane, phenyltrimethylstannane, tetravinylstannane, dimethyldichlorostannane, butyltrichlorostannane, or trichlorophenylstannane.

The oxygen-containing tin compound is, for example, tributyltin methoxide, tin tert-butoxide, dibutyltin diacetate, triphenyltin acetate, tributyltin oxide, triphenyltin acetate, triphenyltin hydroxide, butyl chlorotin dihydroxide, or acetylacetonatotin.

The nitrogen-containing tin compound is, for example, dimethylamino trimethyltin, tris(dimethylamino)tert-butyltin, azidotrimethyltin, tetrakis(dimethylamino)tin, or N,N'-di-tert-butyl-2,3-diamidobutane tin (II).

The tin halide compound is, for example, tin chloride, tin bromide, tin iodide, dimethyltin dichloride, butyltin trichloride, or phenyltin trichloride. Further, the tin halide compound may be tetravalent tin chloride, tin bromide, or tin iodide.

When the top deposit TD contains tin, the nitrogen-containing inorganic compound is, for example, $NH_3$ or $N_2O_4$. The sulfur-containing inorganic compound is, for example, $H_2S$, $SO_2$, COS, or $CS_2$. The halogen compound is, for example, $CF_4$, $F_2$, or $CCl_4$. The carbon-containing substance is a hydrocarbon, carbon fluoride, an organic compound with a hydroxyl group, carboxylic acid, anhydrous carboxylic acid, or carboxylic acid halide. The hydrocarbon is, for example, methane or propylene. The carbon fluoride is, for example, $CF_4$ or $C_4F_6$. The organic compound with the hydroxyl group is, for example, alcohols such as methanol and ethylene glycol, or phenols. The carboxylic acid is, for example, acetic acid or oxalic acid. The silicon-containing substance is, for example, silicon chloride or aminosilane.

When the top deposit TD contains molybdenum, the deposition processing gas includes a molybdenum-containing substance. The deposition processing gas includes, for example, molybdenum halide. The molybdenum halide is, for example, molybdenum hexafluoride ($MoF_6$) or molybdenum hexachloride ($MoCl_6$). The deposition processing gas may further include a noble gas such as argon gas or helium gas. The deposition processing gas may further include a hydrogen-containing gas such as $H_2$ gas.

After step STb, step STc is performed. In step STc, a first film F1 is formed along the surface of the top deposit TD and the sidewall surface SW defining the opening OP, as illustrated in FIG. 2C. The first film F1 is a sub-conformal film. The thickness of the first film F1 decreases along the depth direction of the opening OP. In step STc, the first film F1 is formed to improve the verticality of the sidewall surface defining the opening OP on the substrate W after the first film F1 is formed. The first film F1 may be a silicon oxide film, a carbon-containing film, or a metal-containing film.

In step STc, the first film F1 may be formed by an unsaturated Atomic Layer Deposition (ALD) or CVD method. In the unsaturated ALD method (unsaturated atomic layer deposition method), a cycle including first to fourth steps is repeated as in an ALD method. In the first step, a first gas (precursor gas) is supplied to the substrate W. In the second step, a chamber accommodating the substrate W therein is purged. In the third step, a second gas (reactive gas) is supplied to the substrate W. In a third process, plasma may be generated from the second gas. In the fourth step, the chamber accommodating the substrate W therein is purged. When the first film F1 is a silicon oxide film, the first gas includes, for example, an aminosilane-based gas, $SiCl_4$ gas, or $SiF_4$ gas, and the second gas includes, for example, an oxygen-containing gas such as $O_2$ gas. When the first film F1 is a carbon-containing film, the first gas includes, for example, an organic compound gas. The organic compound gas includes, for example, epoxide, carboxylic acid, carboxylic acid halide, anhydrous carboxylic acid, isocyanate, and phenols. When the first film F1 is a carbon-containing film, the second gas includes, for example, an inorganic compound gas having N—H bonds, an inert gas, water vapor ($H_2O$ gas), a mixed gas of nitrogen gas and hydrogen gas, and a mixed gas of hydrogen gas and oxygen gas.

The unsaturated ALD method is performed by either one of a first method or a second method. In the first method, the precursor included in the first gas is adsorbed onto the entire surface of the substrate W during the first step, and the supply of the second gas is controlled such that the second gas does not spread over the entire surface of the substrate W during the third step. That is, the first method uses a local reaction. In the second method, the precursor is adsorbed onto only a portion of the surface of the substrate W during the first step, and the second gas is supplied to the entire surface of the substrate W during the third step. That is, the second method uses a local adsorption of the precursor. The local reaction and the local adsorption are performed by controlling, for example, one or more of the temperatures of the substrate support unit that supports the substrate W, the pressure in the chamber, the flow rate and the supply time of the first gas (precursor gas), the flow rate and the supply time of the second gas (reaction gas), and the processing time. When plasma is used in the unsaturated ALD method, the power level of the Radio Frequency (RF) power supplied for plasma generation may be adjusted.

Step STd is performed after step STc. In step STd, as illustrated in FIG. 2D, a second film F2 is formed by adsorbing a precursor onto the substrate W and modifying the precursor on the substrate W. The modification of the precursor is progressed by, for example, a reaction between a precursor derived from the precursor gas and a reactive substance derived from the reactive gas. The second film F2 may be formed on the substrate W by the atomic layer deposition (ALD) method. The second film F2 is formed conformally on the surface of the substrate W. The second film F2 may be a sub-conformal film. In this case, the thickness of the second film F2 decreases along the depth direction of the opening OP. The second film F2 may be formed by the unsaturated ALD method. The second film F2 is, for example, a tungsten-containing film, a tin-containing film, an aluminum-containing film, or a hafnium-containing film. In the ALD method, a cycle including first to fourth steps is repeated. In the first step, a first gas (precursor gas) is supplied to the substrate W. In the second step, the chamber accommodating the substrate W therein is purged. In the third step, a second gas (reactive gas) is supplied to the substrate W. In the fourth step, the chamber accommodating the substrate W therein is purged.

When the second film F2 is a tungsten-containing film, the first gas includes, for example, $WF_6$, $WCl_5$, or $WCl_6$, and the second gas includes at least one of, for example, a hydrogen-containing gas and an oxygen-containing gas. The hydrogen-containing gas may be, for example, hydrogen gas ($H_2$ gas). The oxygen-containing gas may be, for example, oxygen gas ($O_2$ gas). The hydrogen-containing gas may include, for example, nitrogen. Examples of the hydrogen-containing gas including nitrogen include ammonia gas and a mixed gas of nitrogen gas and hydrogen gas. When the second film F2 is a tin-containing film, the first gas includes, for example, $SnCl_4$, $SnBr_4$, and $SnI_4$, and the second gas includes, for example, at least one of the hydrogen-containing gas and the oxygen-containing gas. When the second film F2 is an aluminum-containing film, the first gas includes, for example, trimethylaluminum gas, and the second gas includes, for example, water vapor ($H_2O$ gas). When the second film F2 is a hafnium-containing film, the first gas includes, for example, $HfCl_4$, and the second gas includes, for example, water vapor ($H_2O$ gas).

Figure 3A:
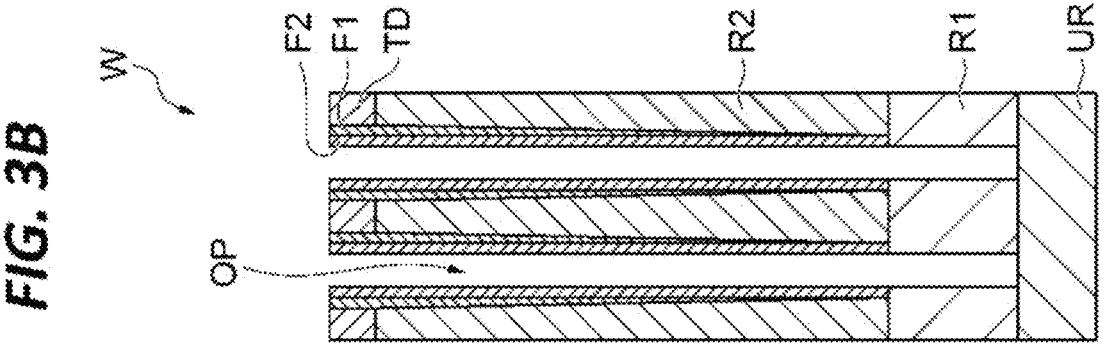
FIGS. 3A and 3B are each a partially enlarged cross-sectional view of an example of a substrate processed in a corresponding step of the substrate processing method according to an embodiment.

Step STbt is performed between steps STd and STe. In step STbt, the second film F2 is partially removed as illustrated in FIG. 3A. That is, the second film F2 is removed on the first region R1, i.e., at the bottom of the opening OP. In step STbt, a recess may be formed in the first region R1 by etching the first region R1. In step STbt, the second film F2 may be partially removed by generating plasma from a removal gas. When the second film F2 is a tungsten-containing film, the removal gas includes, for example, a fluorocarbon gas. When the second film F2 is a tin-containing film, the removal gas includes, for example, a hydrogen-containing gas (e.g., hydrogen gas). When the second film F2 is an aluminum-containing film or a hafnium-containing film, the removal gas includes, for example, a processing gas, which is a mixed gas of a halogen-containing gas ($BCl_3$ gas or $Cl_2$ gas) and an oxygen-containing gas ($O_2$ gas, CO gas, $CO_2$ gas, or $N_2O$ gas). Further, in step STbt, a bias signal such as a bias RF signal or a pulsed DC signal may be supplied to the substrate support unit that supports the substrate W in the chamber 10. When the second film F2 is a sub-conformal film, step STbt may not be performed because the second film F2 is not formed at the bottom of the opening OP.

Figure 3B:
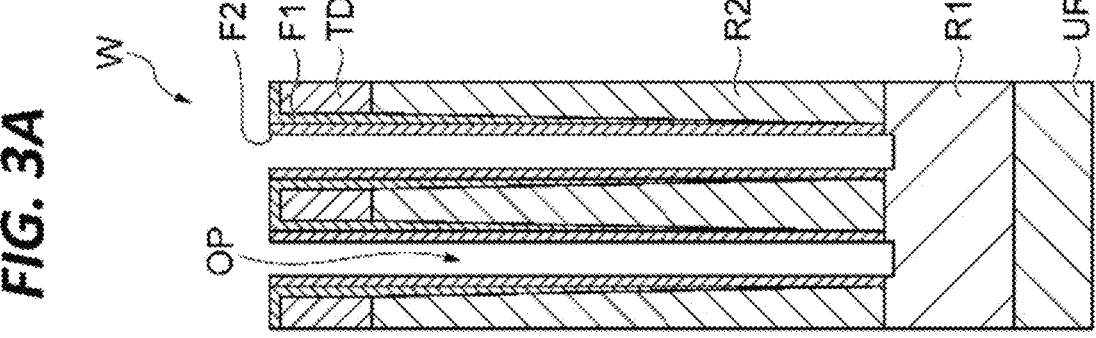

Step STe is performed after step STd. In step STe, the first region R1 is etched as illustrated in FIG. 3B. The first region R1 may be etched by generating plasma from an etching gas. When the first region R1 is a silicon film, the etching gas may include a halogen-containing gas such as HBr or $Cl_2$ gas. When the first region R1 is a silicon oxide film, a silicon nitride film, or a stacked film including a silicon oxide film and a silicon nitride film, the etching gas may include one or more fluorine-containing gases such as fluorocarbon gas, hydrofluorocarbon gas, nitrogen trifluoride gas, or sulfur hexafluoride gas. When the first region R1 is an organic film, the etching gas may include an oxygen-containing gas such as $O_2$ gas. Alternatively, when the first region R1 is an organic film, the etching gas may include $N_2$ gas and $H_2$ gas. Further, in step STe, a bias signal such as a bias RF signal or a pulsed DC signal may be supplied to the substrate support unit that supports the substrate W in the chamber 10.

In the method MT, the top deposit TD is formed on the top TP of the second region R2, so that the thickness of the region providing the opening on the first region R1 increases. Further, the first film F1 and the second film F2 improve the verticality of the sidewall surface defining the opening OP. Thus, according to the method MT, the shape of the region providing the opening OP on the substrate W is adjusted. Further, in the method MT, the mask etching resistance in etching the first region R1 during step STe is enhanced by the top deposit TD and the second film F2.

Hereinafter, descriptions will be made on a plasma processing apparatus and a substrate processing system, which are used in the method MT, according to various embodiments.

Figure 4:
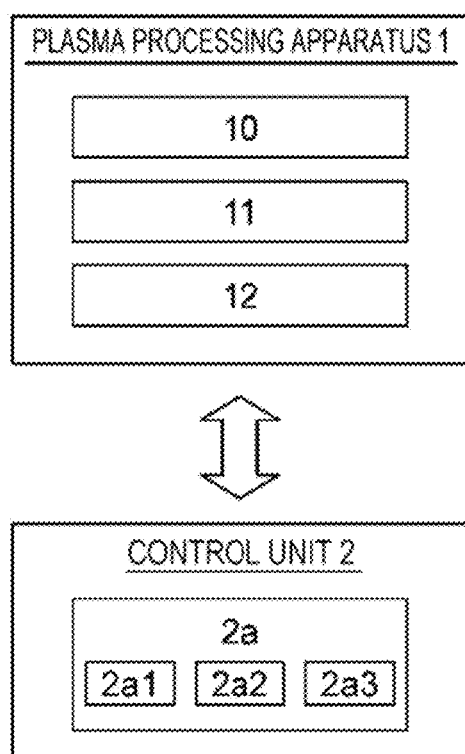
FIG. 4 is a view illustrating an example of a configuration of a plasma processing system.

FIG. 4 is a view illustrating an example of a configuration of a plasma processing system. In an embodiment, the plasma processing system includes a plasma processing apparatus 1 and a control unit 2. The plasma processing system is an example of a substrate processing system, and the plasma processing apparatus 1 is an example of a substrate processing apparatus. The plasma processing apparatus 1 includes a plasma processing chamber 10, a substrate support unit 11, and a plasma generation unit 12. The plasma processing chamber 10 has a plasma processing space. The plasma processing chamber 10 has at least one gas supply port for supplying at least one processing gas to the plasma processing space and at least one gas discharge port for discharging a gas from the plasma processing space. The gas supply port is connected to a gas supply unit 20 to be described below, and the gas discharge port is connected to an exhaust system 40 to be described below. The substrate support unit 11 is disposed in the plasma processing space, and has a substrate support surface for supporting a substrate thereon.

The plasma generation unit 12 is configured to generate plasma from at least one processing gas supplied into the plasma processing space. The plasma formed in the plasma processing space may be, for example, capacitively coupled plasma (CCP), inductively coupled plasma (ICP), electron-cyclotron-resonance plasma (ECR), helicon-wave plasma (HWP), or surface wave plasma (SWP). Further, various types of plasma generation units may be used, including an alternating current (AC) plasma generation unit and a direct current (DC) plasma generation unit. In an embodiment, an AC signal (AC power) used in the AC plasma generation unit has a frequency in the range of 100 kHz to 10 GHz. Accordingly, the AC signal includes an RF (radio frequency) signal and a microwave signal. In an embodiment, the RF signal has a frequency in the range of 100 kHz to 150 MHz.

The control unit 2 processes computer-executable commands for causing the plasma processing apparatus 1 to perform various steps described herein below. The control unit 2 may be configured to control each component of the plasma processing apparatus 1 to perform the various steps described herein. In an embodiment, a portion of the control unit 2 or the entire control unit 2 may be included in the plasma processing apparatus 1. The control unit 2 may include a processing unit 2a1, a storage unit 2a2, and a communication interface 2a3. The control unit 2 is implemented by, for example, a computer 2a. The processing unit 2a1 may be configured to read programs from the storage unit 2a2, and perform various control operations by executing the read programs. The programs may be stored in the storage unit 2a2 in advance, or may be acquired from a medium when necessary. The acquired programs are stored in the storage unit 2a2, and read from the storage unit 2a2 to be executed by the processing unit 2a1. The medium may be any of various storage media readable by the computer 2a, or may be a communication line connected to the communication interface 2a3. The processing unit 2a1 may be a central processing unit (CPU). The storage unit 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

Figure 5:
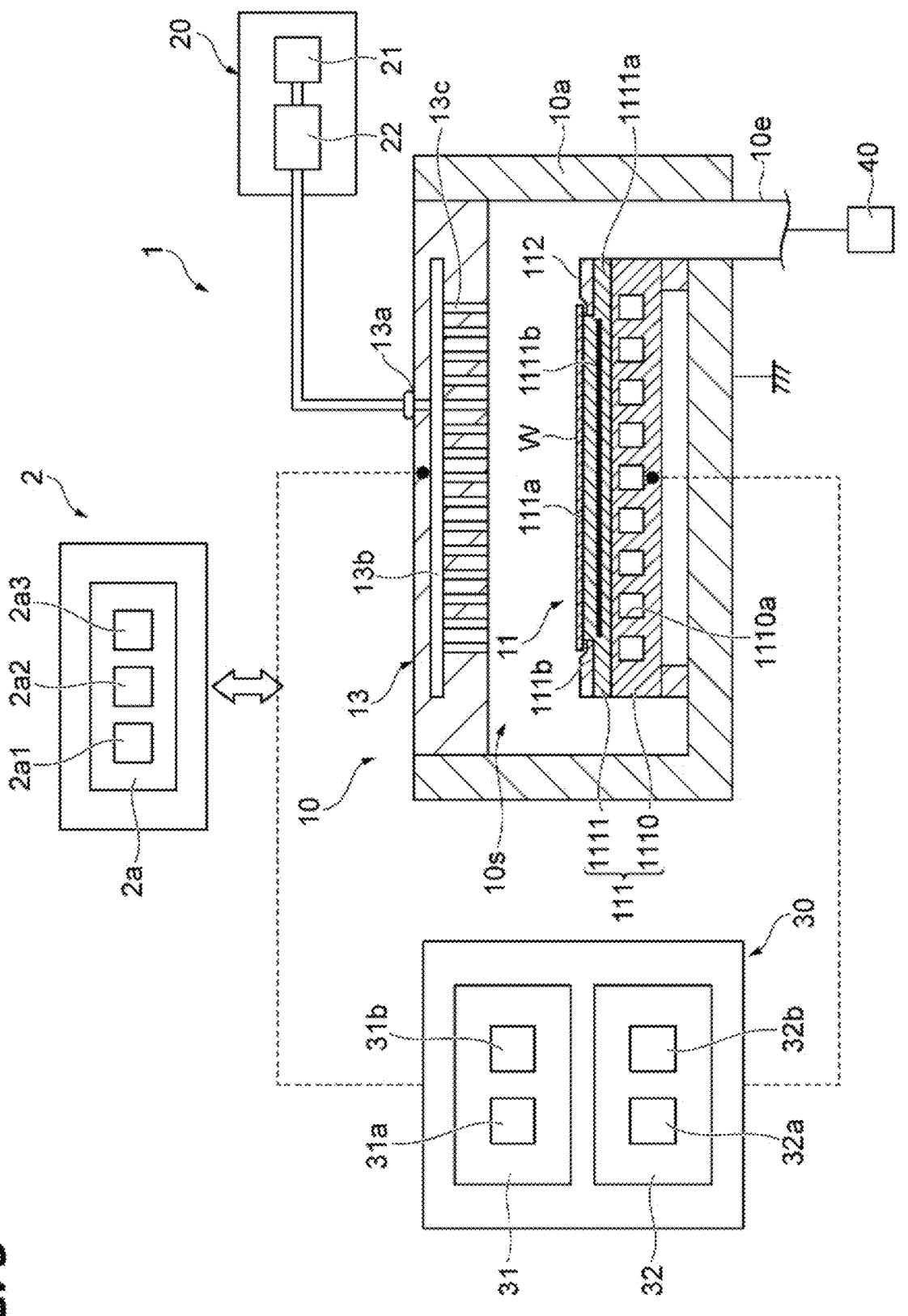
FIG. 5 is a view illustrating an example of a configuration of a capacitively coupled plasma processing apparatus.

Hereinafter, descriptions will be made on an example of a configuration of a capacitively coupled plasma processing apparatus, which is an example of the plasma processing apparatus 1. FIG. 5 is a view illustrating an example of the configuration of the capacitively coupled plasma processing apparatus.

The capacitively coupled plasma processing apparatus 1 includes a plasma processing chamber 10, a gas supply unit 20, a power supply 30, and an exhaust system 40. Further, the plasma processing apparatus 1 includes a substrate support unit 11 and a gas introduction unit. The gas introduction unit is configured to introduce at least one processing gas into the plasma processing chamber 10. The gas introduction unit includes a shower head 13. The substrate support unit 11 is disposed in the plasma processing chamber 10. The shower head 13 is disposed above the substrate support unit 11. In an embodiment, the shower head 13 makes up at least a portion of the ceiling of the plasma processing chamber 10. The plasma processing chamber 10 has a plasma processing space 10s defined by the shower head 13, the sidewall 10a of the plasma processing chamber 10, and the substrate support unit 11. The plasma processing chamber 10 is grounded. The shower head 13 and the substrate support unit 11 are electrically insulated from the housing of the plasma processing chamber 10.

The substrate support unit 11 includes a main body 111 and a ring assembly 112. The main body 111 has a central region 111a for supporting the substrate W and an annular region 111b for supporting the ring assembly 112. A wafer is an example of the substrate W. The annular region 111b of the main body 111 surrounds the central region 111a of the main body 111 in plan view. The substrate W is placed on the central region 111a of the main body 111, and the ring assembly 112 is disposed on the annular region 111b of the main body 111 to surround the substrate W on the central region 111a of the main body 111. Thus, the central region 111a is also referred to as the substrate support surface for supporting the substrate W, and the annular region 111b is also referred to as the ring support surface for supporting the ring assembly 112.

In an embodiment, the main body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111a and an electrostatic electrode 1111b disposed inside the ceramic member 1111a. The ceramic member 1111a has a central region 111a. In an embodiment, the ceramic member 1111a also has the annular region 111b. Another member surrounding the electrostatic chuck 1111, such as an annular electrostatic chuck or an annular insulating member, may have the annular region 111b. In this case, the ring assembly 112 may be disposed on the annular electrostatic chuck or the annular insulating member, or may be disposed on both the electrostatic chuck 111 and the annular insulating member. At least one RF/DC electrode coupled to an RF power supply 31 and/or a DC power supply 32 to be described later may be disposed inside the ceramic member 111a. In this case, the at least one RF/DC electrode serves as a lower electrode. When a bias RF signal and/or a DC signal to be described later is supplied to the at least one RF/DC electrode, the RF/DC electrode is also referred to as a bias electrode. Further, the conductive member of the base 1110 and the at least one RF/DC electrode may function as a plurality of lower electrodes. Further, the electrostatic electrode 1111b may function as a lower electrode. Thus, the substrate support unit 11 includes at least one lower electrode.

The ring assembly 112 includes one or more annular members. In an embodiment, the one or more annular members include one or more edge rings and at least one covering ring. The edge ring is formed of a conductive or insulating material, and the covering ring is formed of an insulating material.

The substrate support unit 11 may further include a temperature adjustment module configured to adjust at least one of the electrostatic chuck 1111, the ring assembly 112, and the substrate, to a target temperature. The temperature adjustment module may include a heater, a heat transfer medium, a flow path 1110a, or a combination thereof. A heat transfer fluid such as brine or gas flows in the flow path 1110a. In an embodiment, the flow path 1110a is formed in the base 1110, and one or more heaters are disposed in the ceramic member 1111a of the electrostatic chuck 1111. Further, the substrate support unit 11 may include a heat transfer gas supply unit configured to supply a heat transfer gas to the gap between the back surface of the substrate W and the central region 111a.

The shower head 13 is configured to introduce at least one processing gas from the gas supply unit 20 into the plasma processing space 10s. The shower head 13 includes at least one gas supply port 13a, at least one gas diffusion chamber 13b, and a plurality of gas introduction ports 13c. The processing gas supplied to the gas supply port 13a passes through the gas diffusion chamber 13b and is introduced into the plasma processing space 10s from the plurality of gas introduction ports 13c. Further, the shower head 13 includes at least one upper electrode. The gas introduction unit may include one or more side gas injectors (SGI) attached to one or more openings formed in the sidewall 10a, in addition to the shower head 13.

The gas supply unit 20 may include at least one gas source 21 and at least one flow controller 22. In an embodiment, the gas supply unit 20 is configured to supply at least one processing gas from each corresponding gas source 21 to the shower head 13 via each corresponding flow controller 22. Each flow controller 22 may include, for example, a mass flow controller or a pressure-controlled flow controller. Further, the gas supply unit 20 may include at least one flow modulation device that modulates or pulses the flow rate of at least one processing gas.

The power supply 30 includes an RF power supply 31 coupled to the plasma processing chamber 10 via at least one impedance matching circuit. The RF power supply 31 is configured to supply at least one RF signal (RF power) to at least one lower electrode and/or at least one upper electrode. As a result, plasma is formed from at least one processing gas supplied into the plasma processing space 10s. Thus, the RF power supply 31 may function as at least a portion of the plasma generation unit 12. Further, by supplying a bias RF signal to at least one lower electrode, a bias potential may be generated on the substrate W, so that ion components in the formed plasma may be drawn to the substrate W.

In an embodiment, the RF power supply 31 includes a first RF generation unit 31a and a second RF generation unit 31b. The first RF generation unit 31a is coupled to at least one lower electrode and/or at least one upper electrode via at least one impedance matching circuit, and configured to generate a source RF signal (source RF power) for plasma generation. In an embodiment, the source RF signal has a frequency in the range of 10 MHz to 150 MHz. In an embodiment, the first RF generation unit 31a may be configured to generate a plurality of source RF signals having different frequencies. The generated one or multiple source RF signals are supplied to the at least one lower electrode and/or at least one upper electrode.

The second RF generation unit 31b is coupled to at least one lower electrode via at least one impedance matching circuit, and configured to generate a bias RF signal (bias RF power). The frequency of the bias RF signal may be the same as or different from the frequency of the source RF signal. In an embodiment, the bias RF signal has a frequency lower than the frequency of the source RF signal. In an embodiment, the bias RF signal has a frequency in the range of 100 kHz to 60 MHz. In an embodiment, the second RF generation unit 31b may be configured to generate a plurality of bias RF signals having different frequencies. The generated one or multiple bias RF signals are supplied to the at least one lower electrode. In various embodiments, at least one of the source RF signal and the bias RF signal may be pulsed.

The power supply 30 may further include a DC power supply 32 coupled to the plasma processing chamber 10. The DC power supply 32 includes a first DC generation unit 32a and a second DC generation unit 32b. In an embodiment, the first DC generation unit 32a is connected to at least one lower electrode, and configured to generate a first DC signal. The generated first DC signal is applied to the at least one lower electrode. In an embodiment, the second DC generation unit 32b is connected to at least one upper electrode, and configured to generate a second DC signal. The generated second DC signal is applied to the at least one upper electrode.

In various embodiments, the first and second DC signals may be pulsed. In this case, a sequence of voltage pulses is applied to at least one lower electrode and/or at least one upper electrode. The voltage pulse may have a rectangular, trapezoidal, or triangular pulse waveform, or a combination thereof. In an embodiment, a waveform generation unit for generating the sequence of the voltage pulses from a DC signal is connected between the first DC generation unit 32a and at least one lower electrode. Thus, the first DC generation unit 32a and the waveform generation unit make up a voltage pulse generation unit. When the second DC generation unit 32b and the waveform generation unit make up the voltage pulse generation unit, the voltage pulse generation unit is connected to at least one upper electrode. The voltage pulse may have a positive or negative polarity. The sequence of the voltage pulse may include one or more positive polarity voltage pulses and one or more negative polarity voltage pulses within one cycle. The first and second DC generation units 32a and 32b may be provided in addition to the RF power supply 31, or the first DC generation unit 32a may be provided in place of the second RF generation unit 31b.

The exhaust system 40 may be connected to a gas discharge port 10e formed at, for example, the bottom of the plasma processing chamber 10. The exhaust system 40 may include a pressure regulation valve and a vacuum pump. The pressure in the plasma processing space 10s is regulated by the pressure regulation valve. The vacuum pump may include a turbo molecular pump, a dry pump, or a combination thereof.

All steps of the method MT may be performed in the plasma processing apparatus 1. Each step of the method MT may be brought by the control of each component of the plasma processing apparatus 1 by the control unit 2. In step STa, the substrate W is placed on the substrate support unit 11. The gas used in each of steps STb to STe of the method MT is supplied from the gas supply unit 20 into the chamber 10. In each of steps STb to STe of the method MT, the pressure in the chamber 10 is regulated to a specified pressure by the exhaust system 40. When plasma is generated in the chamber 10 during each of steps STb to STe of the method MT, the plasma is generated by the plasma generation unit 12. For example, the plasma is generated by supplying a source RF signal from the first RF generation unit 31a. When ions from the plasma are drawn into the substrate W in each of steps STb to STe of the method MT, a bias signal is supplied to at least one lower electrode from at least one of the second RF generation unit 31b and the first DC generation unit 32a. The bias signal is at least one of a bias RF signal and a pulsed first DC signal.

Figure 6:
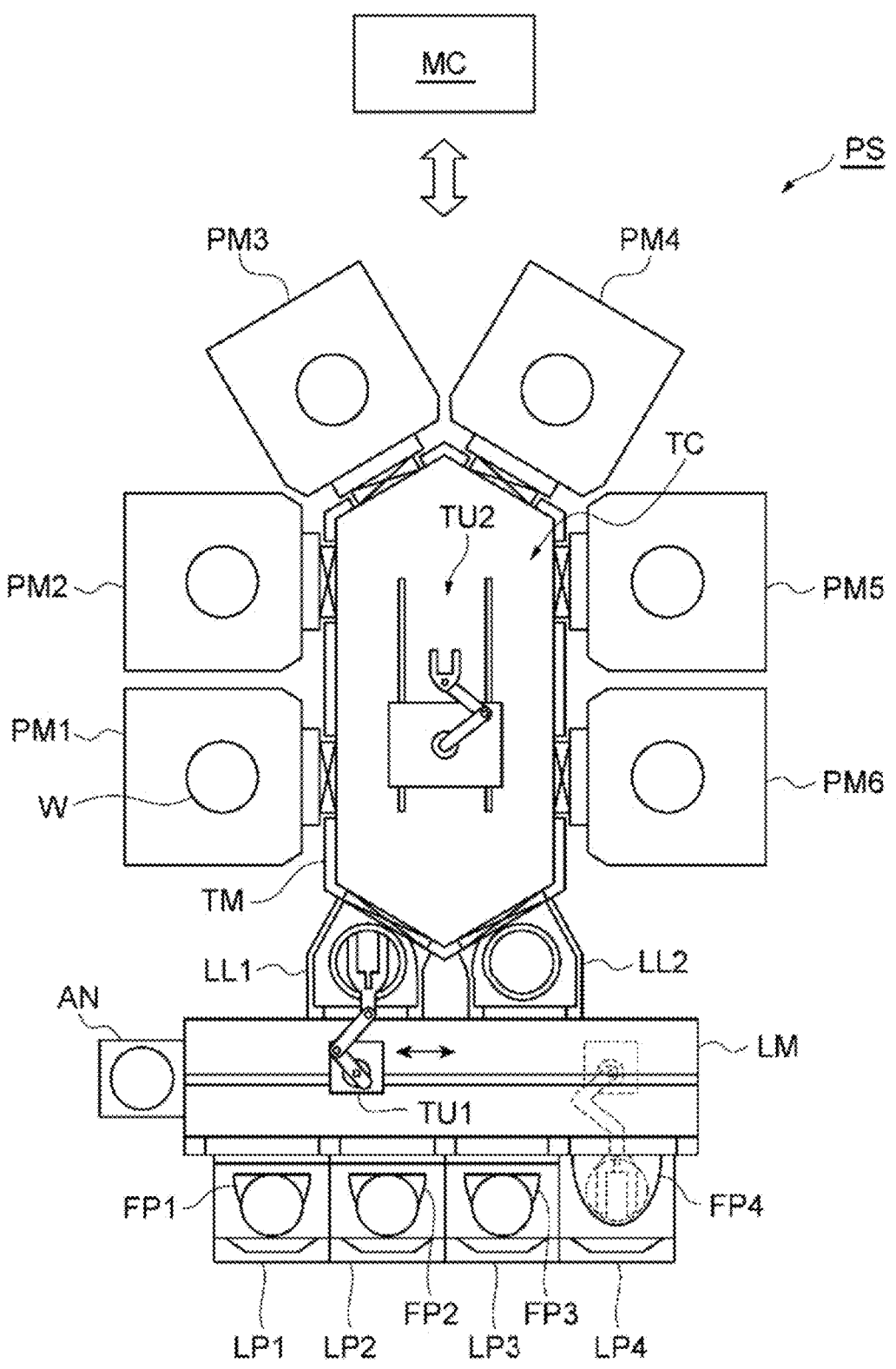
FIG. 6 is a view illustrating a substrate processing system according to an embodiment.

Hereinafter, FIG. 6 will be referred to. FIG. 6 is a view illustrating a substrate processing system according to an embodiment. A substrate processing system PS illustrated in FIG. 6 may be used in the method MT. The substrate processing system PS is provided with tables LP1 to LP4, containers FP1 to FP4, a loader module LM, an aligner AN, load lock modules LL1 and LL2, process modules PM1 to PM6, a transfer module TM, and a control unit MC. The number of tables, the number of containers, and the number of load lock modules in the substrate processing system PS may be one or more. The number of process modules in the substrate processing system PS may be two or more.

The tables LP1 to LP4 are arranged along one edge of the loader module LM. Each of the tables LP1 to LP4 is, for example, a load port. The containers FP1 to FP4 are mounted on the tables LP1 to LP4, respectively. Each of the containers FP1 to FP4 is, for example, a container called a front opening unified pod (FOUP). Each of the containers FP1 to FP4 is configured to accommodate the substrate W therein.

The loader module LM has a chamber. The pressure in the chamber of the loader module LM is set to the atmospheric pressure. The loader module LM includes a transfer device TU1. The transfer device TU1 is, for example, a transfer robot, and is controlled by the control unit MC. The transfer device TU1 is configured to transfer the substrate W through the chamber of the loader module LM. The transfer device TU1 may transfer the substrate W between each of the containers FP1 to FP4 and the aligner AN, between the aligner AN and each of the load lock modules LL1 and LL2, and between each of the load lock modules LL1 and LL2 and the containers FP1 to FP4. The aligner AN is connected to the loader module LM. The aligner AN is configured to adjust the position and/or direction of the substrate W (position calibration).

Each of the load lock modules LL1 and LL2 is provided between the loader module LM and the transfer module TM. Each of the load lock modules LL1 and LL2 provides a preliminary decompression chamber.

The transfer module TM is connected to each of the load lock modules LL1 and LL2 via a gate valve. The transfer module TM includes a transfer chamber TC with the internal space that may be decompressed. The transfer module TM includes a transfer device TU2. The transfer device TU2 is, for example, a transfer robot, and is controlled by the control unit MC. The transfer device TU2 is configured to transfer the substrate W through the transfer chamber TC. The transfer device TU2 may transfer the substrate W between each of the load lock modules LL1 and LL2 and each of the process modules PM1 to PM6, and between any two process modules among the process modules PM1 to PM6.

Each of the process modules PM1 to PM6 is a device configured to perform its dedicated substrate processing. Each of the process modules PM1 to PM6 may be a plasma processing apparatus such as the plasma processing apparatus 1. The plasma generated by the plasma generation unit of each of the process modules PM1 to PM6 may be capacitively coupled plasma, inductively coupled plasma, ECR plasma, helicon wave excited plasma, or surface wave plasma.

The control unit MC is configured to control each component of the substrate processing system PS. The control unit MC may be a computer equipped with, for example, a processor, a storage device, an input device, and a display device. The control unit MC executes control programs stored in the storage device, and controls each component of the substrate processing system PS based on recipe data stored in the storage device. Each step of the method MT may be brought by the control of each component of the substrate processing system PS by the control unit MC.

In step STa, the substrate W may be transferred to one process module used in step STb among the process modules PM1 to PM6 by the transfer devices TU1 and TU2.

In an embodiment, steps STb, STc, and STd may be performed in one process module among the process modules PM1 to PM6. In this case, steps STbt and STe may be performed in another process module among the process modules PM1 to PM6, or may be performed in other two process modules, respectively, among the process modules PM1 to PM6.

In another embodiment, step STb may be performed in one process module among the process modules PM1 to PM6, and steps STc and STd may be performed in another process module among the process modules PM1 to PM6. In this case, steps STbt and STe may be performed in another process module among the process modules PM1 to PM6, or may be performed in other two process modules, respectively, among the process modules PM1 to PM6.

In yet another embodiment, steps STb, STc, and STd may be performed in three process modules, respectively, among the process modules PM1 to PM6. In this case, steps STbt and STe may be performed in another process module among the process modules PM1 to PM6, or may be performed in other two process modules, respectively, among the process modules PM1 to PM6.

Figure 7:
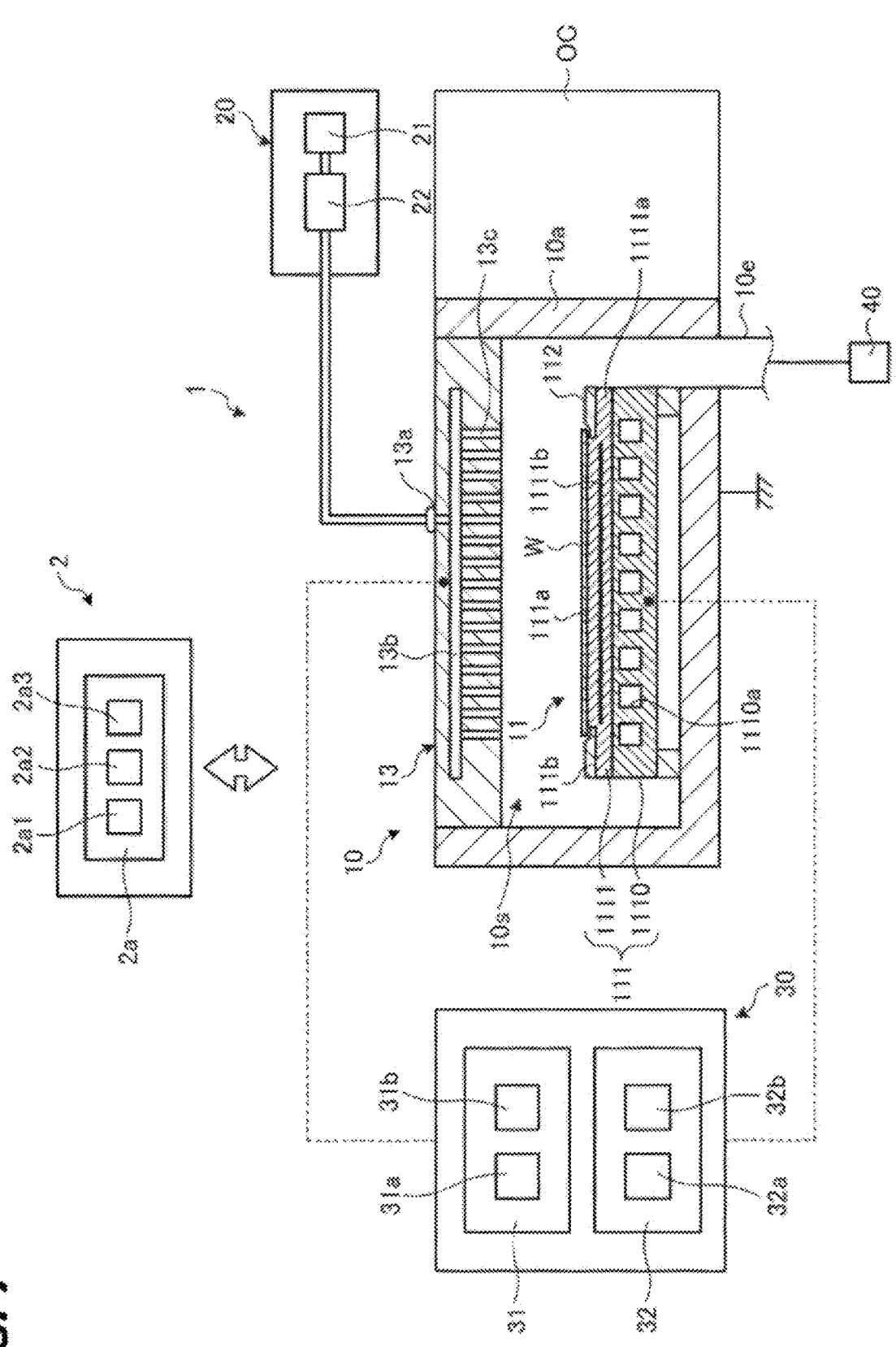
FIG. 7 is a view schematically illustrating a plasma processing apparatus according to an embodiment.

FIG. 7 is a view schematically illustrating a plasma processing apparatus according to an embodiment. As illustrated in FIG. 7, the plasma processing apparatus 1 of FIG. 5 may further include an optical observation device OC. The optical observation device OC may include a chamber that may communicate with the plasma processing chamber 10. The substrate W may be moved between the plasma processing chamber 10 and the chamber of the optical observation device OC by a transfer robot. The substrate W may be accommodated in the chamber of the optical observation device OC by the transfer robot, and may be aligned in the chamber of the optical observation device OC. Then, the optical observation device OC may measure the dimension (critical dimension (CD)) of a recess RS of the substrate W (see, e.g., FIG. 10). The optical observation device OC may measure the thickness of a protective film PR of the substrate W (see, e.g., FIG. 12). The measurement results may be transmitted from the optical observation device OC to the control unit 2.

Figure 8:
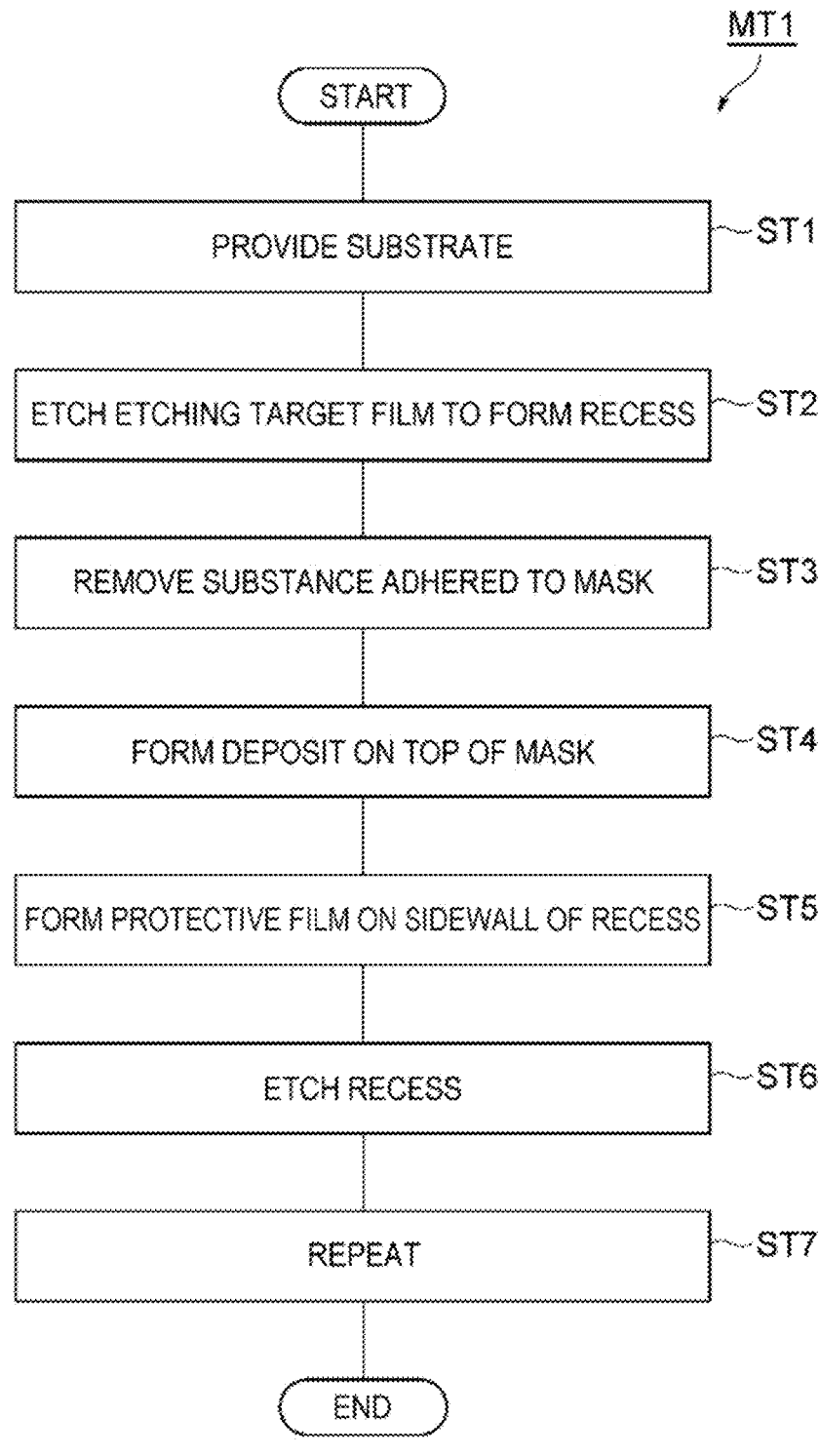
FIG. 8 is a flowchart of an etching method according to an embodiment.

FIG. 8 is a flowchart of an etching method according to an embodiment. An etching method MT1 illustrated in FIG. 8 (hereinafter, referred to as a "method MT1") may be performed by the plasma processing apparatus 1 of the embodiment described above. The method MT1 may be applied to the substrate W. The method MT1 is an example of a substrate processing method.

Figure 9:
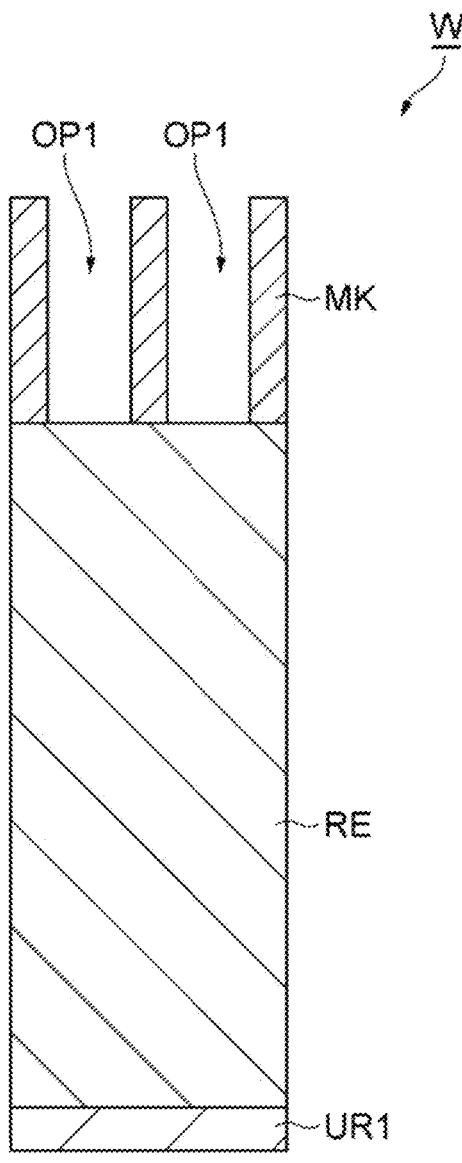
FIG. 9 is a cross-sectional view of an example of a substrate to which the method of FIG. 8 may be applied.

FIG. 9 is a cross-sectional view of an example of a substrate to which the method of FIG. 8 may be applied. As illustrated in FIG. 9, in an embodiment, the substrate W includes an etching target film RE and a mask MK on the etching target film RE. The etching target film RE may be formed on an underlying film UR1. The mask MK may have at least one opening OP1.

The etching target film RE may include at least one of a silicon-containing film and an organic film. The silicon-containing film may include at least one of a silicon film, a silicon germanium film, a silicon oxide film, and a silicon nitride film. The silicon-containing film may be a stacked film in which a silicon oxide film and a silicon nitride film are stacked alternately. The organic film may be an amorphous carbon film. The etching target film RE may be, for example, a film for a memory device such as a DRAM or a 3D-NAND.

The mask MK may include at least one of a silicon-containing substance, an organic substance, and a metal. The silicon-containing substance may include polysilicon. The organic substance may include at least one of photoresist and a spin-on carbon (SOC). When the etching target film RE includes a silicon-containing film, the mask MK may include at least one of a second silicon-containing substance different from a first silicon-containing substance that makes up the silicon-containing film, an organic substance, and a metal. When the etching target film includes an organic film, the mask MK may include at least one of a silicon-containing substance, a second organic substance different from a first organic substance that makes up the organic film, and a metal.

The underlying film UR1 may include a material different from that of the etching target film RE. The underlying film UR1 may include at least one of a silicon-containing film, an organic film, and a metal-containing film.

Hereinafter, description will be made on the method MT1 with reference to FIGS. 8 to 13, assuming an example where the method MT1 is applied to the substrate W using the plasma processing apparatus 1 of the embodiment described above. Each of FIGS. 10 to 13 is a cross-sectional view of one step of the etching method according to an embodiment. When the plasma processing apparatus 1 is used, the method MT1 may be performed in the plasma processing apparatus 1 under the control of each component of the plasma processing apparatus 1 by the control unit 2. In the method MT1, as illustrated in FIG. 7, the substrate W on the substrate support unit 11 (substrate support) disposed in the plasma processing chamber 10 is processed.

As illustrated in FIG. 8, the method MT1 may include steps ST1 to ST7. Steps ST1 to ST7 may be sequentially performed. The method MT1 may not include at least one of steps ST2, ST3, ST6, and ST7. Step ST5 may be performed after step ST3 and before step ST4.

In step ST1, the substrate W illustrated in FIG. 9 is provided. The substrate W may be provided in the plasma processing chamber 10. The substrate W may be supported by the substrate support unit 11 in the plasma processing chamber 10.

In step ST2, as illustrated in FIG. 10, the etching target film RE is etched by a first plasma PL1 generated from the first processing gas, so that the recess RS is formed. The recess RS may correspond to the opening OP1 of the mask MK. The dimension of the recess RS at the upper end of the recess RS may be 100 nm or less. The dimension of the recess RS may gradually decrease from the upper end toward the bottom of the recess RS. The aspect ratio of the recess RS may be 5 or more. The bottom of the recess RS may or may not reach the underlying film UR1. The recess RS may be an opening.

When the etching target film RE includes a silicon-containing film, the first processing gas may include a halogen-containing gas. The halogen-containing gas may include at least one of a fluorine-containing gas and a chlorine-containing gas. When the first processing gas includes the fluorine-containing gas, the etching target film RE may include a silicon oxide film or a silicon nitride film. When the first processing gas includes a chlorine-containing gas, the etching target film RE may include a silicon film or a silicon germanium film. Examples of the fluorine-containing gas include fluorocarbon ($C_xF_y$) gas, hydrofluorocarbon ($C_xH_yF_z$) gas, and nitrogen trifluoride ($NF_3$ gas). Here, x, y, and z are natural numbers. The first processing gas may include an oxygen-containing gas.

When the etching target film includes an organic film, the first processing gas may include an oxygen-containing gas. Examples of the oxygen-containing gas include oxygen gas, carbon monoxide gas, carbonyl sulfide (COS) gas, and sulfur oxide ($SO_2$) gas.

Step ST2 may be performed as follows. First, the gas supply unit 20 supplies the first processing gas into the plasma processing chamber 10. Subsequently, the plasma generation unit 12 generates the first plasma PL1 from the first processing gas in the plasma processing chamber 10. The control unit 2 controls the gas supply unit 20 and the plasma generation unit 12 to etch the etching target film RE by the first plasma PL1, thereby forming the recess RS.

Step ST2 may be performed simultaneously with step ST1. The underlying film UR1 makes up a first region. The etching target film RE and the mask MK make up a second region. The opening OP1 of the mask MK (first opening) and the recess RS of the etching target film RE (second opening) make up the opening OP.

In step ST3, substances adhered to the mask MK during step ST2 may be removed by a fourth plasma generated from a fourth processing gas. When the etching target film RE includes a silicon-containing film, the adhered substance may include fluorine and carbon. The fourth processing gas may include an oxygen-containing gas. Examples of the oxygen-containing gas include oxygen gas. When the etching target film RE includes an organic film, there may not be any substances adhered to the mask MK during step ST2. In this case, step ST3 may be omitted.

Step ST3 may be performed as follows. First, the gas supply unit 20 supplies the fourth processing gas into the plasma processing chamber 10. Subsequently, the plasma generation unit 12 generates the fourth plasma from the fourth processing gas in the plasma processing chamber 10. The control unit 2 controls the gas supply unit 20 and the plasma generation unit 12 to remove the substance adhered to the mask MK by the fourth plasma.

In step ST4, the deposit DP is formed on the top surface MKt of the mask MK by a second plasma PL2 generated from a second processing gas, as illustrated in FIG. 11. The deposit DP may not be formed on the sidewall of the opening OP1 of the mask MK. The deposit DP is a top deposit that is formed on the top of the mask MK.

The deposit DP may include at least one of silicon, carbon, boron, and a metal. Examples of the metal include titanium, tungsten, and tin.

The second processing gas may include at least one of a silicon-containing gas, a carbon-containing gas, a boron-containing gas, and a metal-containing gas. Examples of the silicon-containing gas include $SiCl_4$ gas, $SiF_4$ gas, and $Si_2Cl_6$ gas. Examples of the carbon-containing gas include hydrocarbon gases such as $CH_4$ gas, $C_2H_2$ gas or $C_3H_6$ gas. Examples of the boron-containing gas include $BCl_3$ gas. The metal-containing gas may include at least one of a tungsten-containing gas and a tin-containing gas. Examples of the tungsten-containing gas include tungsten hexafluoride ($WF_6$) gas. Examples of the tin-containing gas include TDMASn (tetrakisdimethylaminotin (IV)) gas, $SnCl_4$ gas, $SnBr_4$ gas, and $SnI_4$ gas. The second processing gas may include hydrogen gas. The second processing gas may include a noble gas.

Step ST4 may be performed as follows. First, the gas supply unit 20 supplies the second processing gas into the plasma processing chamber 10. Subsequently, the plasma generation unit 12 generates the second plasma PL2 from the second processing gas in the plasma processing chamber 10. The control unit 2 controls the gas supply unit 20 and the plasma generation unit 12 to form the deposit DP on the top surface MKt of the mask MK.

Figure 12:
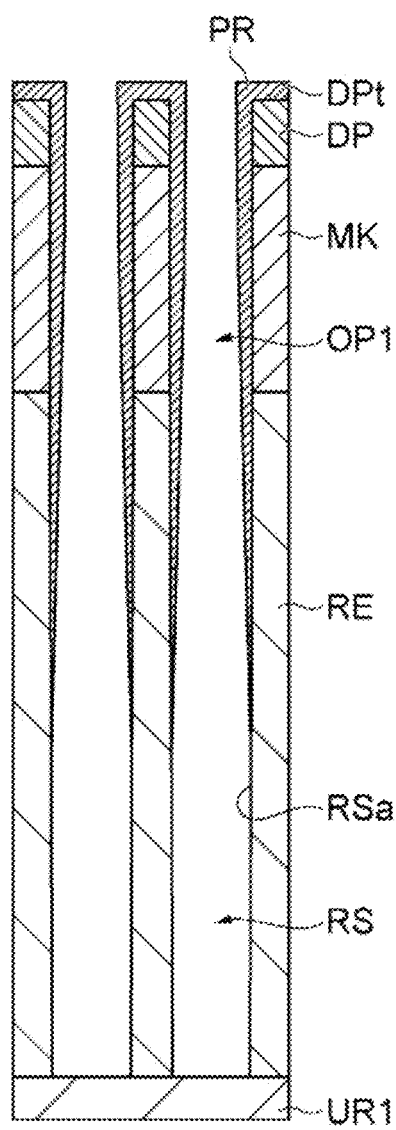
FIG. 12 is a cross-sectional view illustrating one step of the etching method according to an embodiment.

In step ST5, the protective film PR is formed on the sidewall RSa of the recess RS, as illustrated in FIG. 12. The protective film PR may also be formed on the sidewall of the opening OP1. The protective film PR may also be formed on the top surface DPt of the deposit DP. The protective film PR may also be formed on the side surface of the deposit DP. The protective film PR may have a first thickness at the top surface DPt of the deposit DP. The protective film PR may have a second thickness at the sidewall RSa of the recess RS. The second thickness is smaller than the first thickness. The thickness of the protective film PR may gradually decrease from the top surface DPt of the deposit DP toward the bottom of the recess RS. In this case, the protective film PR is a film that is not conformal (sub-conformal film). The protective film PR may not be formed at the bottom of the recess RS. When step ST5 is performed before step ST4, the protective film PR may be formed on the top surface MKt of the mask MK. In step ST3, the deposit DP may be formed on the protective film PR at the top surface MKt of the mask MK.

The protective film PR may include the same material as the deposit DP, or may include a different material from the deposit DP. The protective film PR may include at least one of a silicon-containing film, an organic film, and a metal-containing film. The silicon-containing film may include at least one of a silicon oxide film and a silicon nitride film.

The protective film PR may be formed using a fifth processing gas. The fifth processing gas may include at least one of a silicon-containing gas, a carbon-containing gas, and a metal-containing gas.

The protective film PR may be formed by the ALD or CVD method. Examples of the ALD method include a thermal ALD method and a plasma enhanced (PE)-ALD method. When the protective film PR is formed by the ALD method, step ST5 includes an adsorption step of supplying a precursor (fifth processing gas) to the sidewall Rsa of the recess RS, and an activation step of activating the adsorbed precursor. The activation may be performed by plasma generated from a processing gas. The adsorption step and the activation step may be repeated alternately. A purge step may be performed between the adsorption step and the activation step. The thickness of the protective film PR may be adjusted by controlling the precursor not to be adsorbed onto a portion of the surface of the substrate W (e.g., the bottom of the recess) during the adsorption step. For example, the adsorption position may be controlled by forming a factor inhibiting the adsorption of the precursor, on a portion of the surface of the substrate W. Alternatively, the thickness of the protective film PR may be adjusted by controlling plasma, so as not to reach a portion of the surface of the substrate W (e.g., the bottom of the recess) during the activation step.

When the protective film PR includes a silicon-containing film, a silicon-containing gas is used as the precursor in the adsorption step. When the protective film PR includes a silicon oxide film, examples of the silicon-containing gas include aminosilane gas, $SiCl_4$ gas, and $SiF_4$ gas. In the activation step, an oxygen-containing gas is used as the processing gas. Examples of the oxygen-containing gas include oxygen gas. When the protective film PR includes a silicon nitride film, examples of the silicon-containing gas include aminosilane gas, $SiCl_4$ gas, dichlorosilane gas, and hexachlorodisilane gas. In the activation step, a nitrogen-containing gas is used as the processing gas. Examples of the nitrogen-containing gas include nitrogen gas and ammonia gas.

When the protective film PR includes an organic film, an organic gas is used as the precursor in the adsorption step. Examples of the organic gas include epoxide gas, carboxylic acid gas, carboxylic acid halide gas, anhydrous carboxylic acid gas, isocyanate gas, and phenols gas. Various gases are used as the processing gas in the activation step. Examples of the various gases include an inorganic compound gas having N—H bonds, an inert gas, water vapor ($H_2O$ gas), a mixed gas of nitrogen gas and hydrogen gas, and a mixed gas of hydrogen gas and oxygen gas.

When the protective film PR includes a metal film, a metal-containing gas is used as the precursor in the adsorption step. The metal-containing gas may include at least one of an oxygen-containing metal compound, a nitrogen-containing metal compound, a sulfur-containing metal compound, and a halogenated metal. Examples of the halogenated metal include $TiCl_4$, $WF_6$, $WCl_5$, $WCl_6$, $SnCl_4$, $SnBr_4$, and $SnI_4$. In the activation step, at least one of a hydrogen-containing gas and an oxygen-containing gas is used as the processing gas. When the hydrogen-containing gas is used, the protective film PR is a metal-containing film. When the oxygen-containing gas is used, the protective film PR is a metal oxide film. The hydrogen-containing gas may include nitrogen. In this case, the protective film PR is a metal nitride film. Examples of the hydrogen-containing gases including nitrogen include ammonia gas and a mixed gas of nitrogen gas and hydrogen gas.

Step ST5 may be performed as follows. First, the gas supply unit 20 supplies the fifth processing gas into the plasma processing chamber 10. Subsequently, the plasma generation unit 12 generates plasma from the processing gas in the plasma processing chamber 10. The control unit 2 controls the gas supply unit 20 and the plasma generation unit 12, to form the protective film PR on the sidewall RSa of the recess RS by the plasma.

Figure 13:
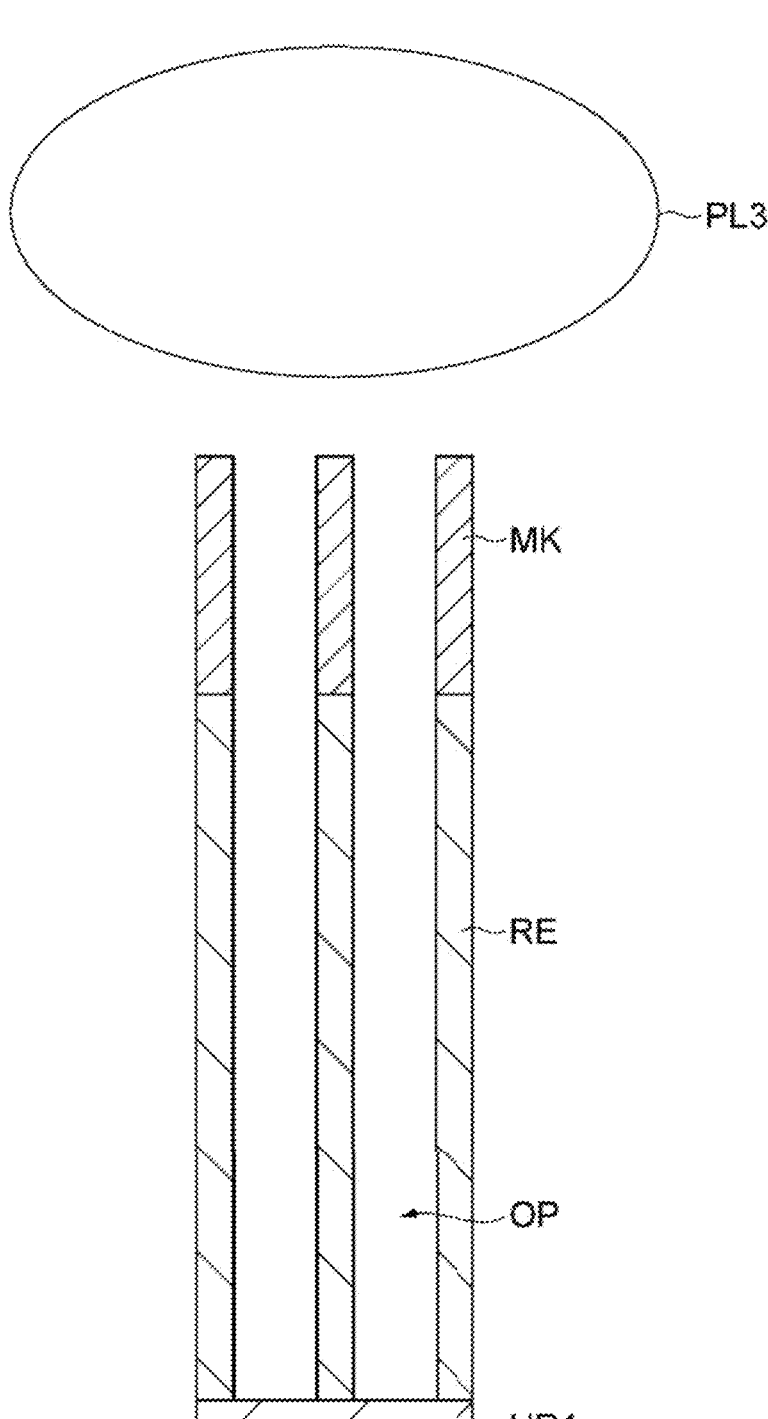
FIG. 13 is a cross-sectional view illustrating one step of the etching method according to an embodiment.

In step ST6, the recess RS is etched by a third plasma PL3 generated from a third processing gas as illustrated in FIG. 13. In step ST6, the protective film PR, the deposit DP, and the mask MK may also be etched. When the bottom of the recess RS reaches the underlying film UR1 in step ST2, the sidewall RSa of the recess RS is mainly etched in step ST6. In this case, since the etching progresses in the lateral direction, the dimension of the recess RS increases. When the bottom of the recess RS does not reach the underlying film UR1 in step ST2, the bottom of the recess RS is mainly etched in step ST6. In this case, since the etching is progressed in the vertical direction, the depth of the recess RS increases. The dimension of the recess RS (opening OP) may be measured by the optical observation device OC or calculated from an SEM image.

The third processing gas may include the same gas as the first processing gas. When the etching target film RE includes a silicon-containing film, the third processing gas may include a halogen-containing gas. When the etching target film RE includes an organic film, the third processing gas may include an oxygen-containing gas.

Step ST6 may be performed as follows. First, the gas supply unit 20 supplies the third processing gas into the plasma processing chamber 10. Subsequently, the plasma generation unit 12 generates the third plasma PL3 from the third processing gas in the plasma processing chamber 10. The control unit 2 controls the gas supply unit 20 and the plasma generation unit 12 to etch the recess RS by the third plasma PL3.

In step ST7, steps ST3 to ST6 are repeated.

According to the plasma processing apparatus 1 and the method MT1 described above, when the recess RS is etched in step ST6, the mask MK is protected by the deposit DP formed on the top surface MKt of the mask MK. Thus, when the recess RS is etched in step ST6, a high etching selectivity with respect to the mask MK may be achieved.

Further, since the sidewall RSa of the recess RS is protected by the protective film PR, the sidewall RSa of the recess RS may be suppressed from being etched in step ST6. As a result, the abnormal shape (bowing) of the recess RS may be suppressed.

When the protective film PR is formed on the top surface DPt of the deposit DP, the deposit DP and the mask MK are protected by the protective film PR. Thus, when the recess RS is etched, an even higher etching selectivity with respect to the mask MK may be achieved. The protective film PR may have a first thickness at the top surface DPt of the deposit DP and a second thickness at the sidewall RSa of the recess RS, and the second thickness may be smaller than the first thickness. In this case, the clogging of the recess RS may be suppressed by the protective film PR, while protecting the deposit DP and the mask MK.

When the method MT1 includes step ST3, the deposit DP may be formed on the top surface MKt of the mask MK in the state where the adhered substance is removed.

When the method MT includes step ST7, the etching amount of the recess RS may be increased.

Figure 14:
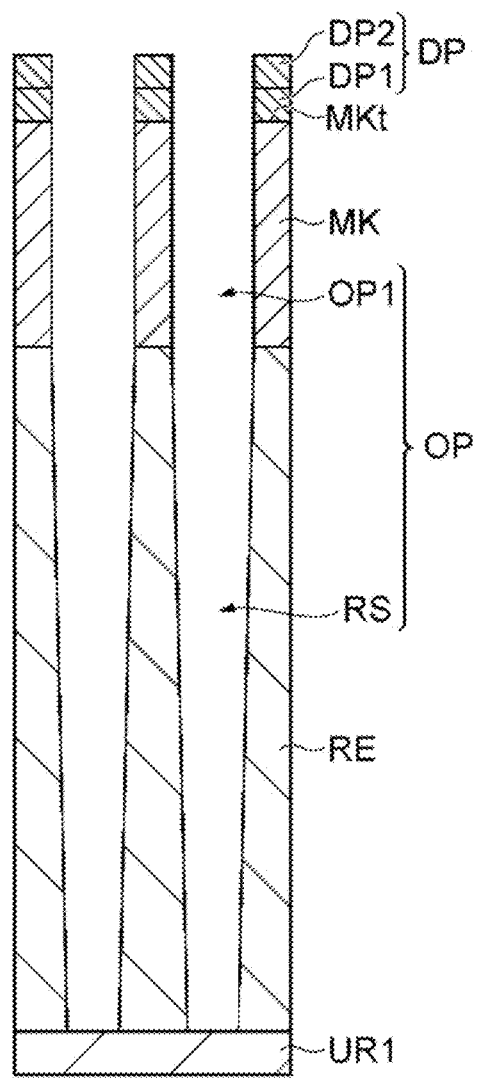
FIG. 14 is a cross-sectional view of an example of a substrate with a deposit including a first deposit and a second deposit.

FIG. 14 is a cross-sectional view of an example of a substrate with a deposit including a first deposit and a second deposit. As illustrated in FIG. 14, the deposit DP may include a first deposit DP1 formed on the top surface MKt of the mask MK and a second deposit DP2 formed on the first deposit DP1. The second deposit DP2 may include a different material from the first deposit DP1. Examples of the materials of the first and second deposits DP1 and DP2 are the same as the examples of the material of the deposit DP. The first deposit DP1 may include carbon, and the second deposit DP2 may include tungsten.

When the deposit DP includes the first deposit DP1 and the second deposit DP2, an appropriate combination of the material of the first deposit DP1 and the material of the second deposit DP2 may be selected in consideration of the materials of the etching target film RE and the mask MK.

While various embodiments have been described, various additions, omissions, substitutions, and modifications may be made without being limited to the embodiments described above. Further, elements in different embodiments may be combined with each other to form other embodiments.

Hereinafter, various experiments conducted to evaluate the method MT1 will be described. The experiments described below are not intended to limit the present disclosure.

First Experiment

In a first experiment, a substrate W including an etching target film RE and a mask MK was prepared. The etching target film RE has a $SiO_2$ film and a SiN film on the $SiO_2$ film. The mask MK is provided on the SiN film. The mask MK includes polysilicon. Subsequently, the substrate W was provided in the plasma processing chamber 10 of the plasma processing apparatus 1 (step ST1).

Then, the SiN film and the $SiO_2$ film were etched by the first plasma PL1 generated from the first processing gas including fluorocarbon gas, to form the recess RS (step ST2).

Then, the substance adhered to the mask MK was removed by the fourth plasma generated from the fourth processing gas including oxygen gas (step ST3). The adhered substance includes carbon and fluorine.

Then, the deposit DP was formed on the top surface MKt of the mask MK by the second plasma PL2 generated from the second processing gas including $SiCl_4$ gas, hydrogen gas, and argon gas (step ST4). The deposit DP includes silicon.

Then, a silicon-containing gas was adsorbed onto the sidewall RSa of the recess RS, to form the protective film PR on the sidewall RSa of the recess RS by plasma generated from a processing gas including an oxygen-containing gas (step ST5). The protective film PR was also formed on the top surface of the deposit DP. The protective film PR was a silicon-containing film. The protective film PR was formed by the ALD method. The protective film PR had a first thickness at the top surface DPt of the deposit DP and a second thickness at the sidewall RSa of the recess RS. The second thickness is smaller than the first thickness.

Then, the recess RS was etched by the third plasma PL3 generated from the third processing gas including fluorocarbon gas (step ST6).

Then, steps ST3 to ST6 were repeated (step ST7).

Second Experiment

In a second experiment, the same method as in the first experiment was performed, except that instead of $SiCl_4$ gas, $CH_4$ gas was used in step ST4. The deposit DP includes carbon.

Third Experiment

In a third experiment, the same method as in the first experiment was performed, except that instead of $SiCl_4$ gas and hydrogen gas, $BCl_3$ gas was used in step ST4. The deposit DP includes boron.

Fourth Experiment

In a fourth experiment, the same method as in the first experiment was performed, except that instead of $SiCl_4$ gas and hydrogen gas, $WF_6$ gas and $CH_4$ gas were used in step ST4. The deposit DP includes tungsten.

Fifth Experiment

In a fifth experiment, the same method as in the first experiment was performed, except that step ST4 was not performed. As a result, no deposit DP is formed.
(Thickness of Deposit)

Figure 15:
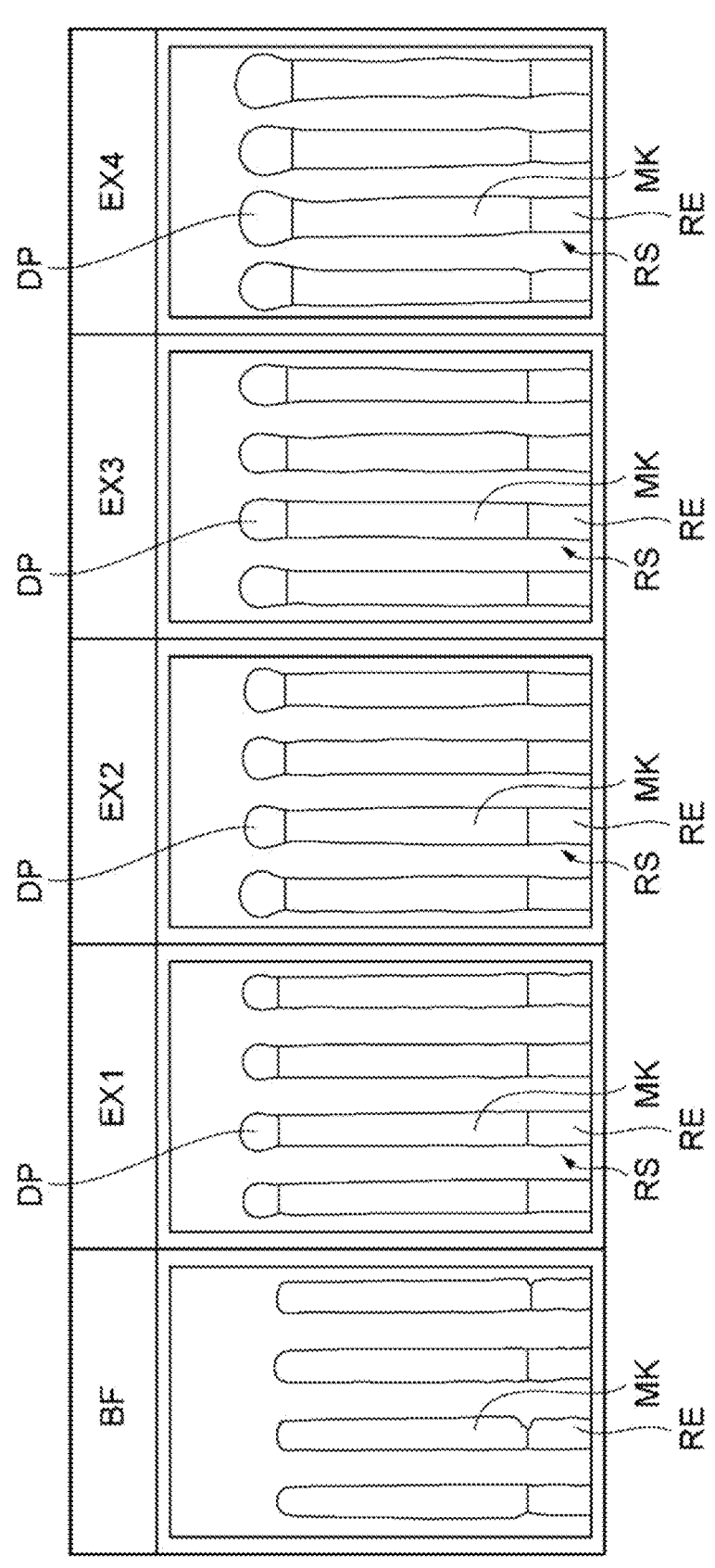
FIG. 15 is a view illustrating an example of the cross section of a substrate before and after a deposit is formed in first to fourth experiments.

FIG. 15 is a view illustrating an example of the cross section of a substrate before and after the deposit is formed in the first to fourth experiments. BF represents an example of the cross section of the substrate before the deposit is formed in the first to fourth experiments. EX1 to EX4 represent examples of the cross sections of the substrates after the deposit is formed in the first to fourth experiments, respectively. In the first experiment, the thickness of the deposit DP is 41 nm. In the second experiment, the thickness of the deposit DP is 40 nm. In the third experiment, the thickness of the deposit DP is 44 nm. In the fourth experiment, the thickness of the deposit DP is 48 nm. In the first experiment, the clogging of the opening OP1 of the mask MK by the deposit DP is suppressed, as compared to the second and third experiments. In the second and third experiments, the clogging of the opening OP1 of the mask MK by the deposit DP is suppressed, as compared to the fourth experiment.

In the first, third, and fourth experiments, the thickness of the deposit DP does not change even though the protective film PR is formed in step ST5. In the second experiment, the thickness of the deposit DP is 22 nm after the protective film PR is formed in step ST5. This is presumably because the deposit DP is etched by the plasma generated from the oxygen gas during the activation step when the protective film PR is formed by the ALD method.
(Thickness of Protective Film)

Figures 16A, 16B, 16C, 16D, 16E:
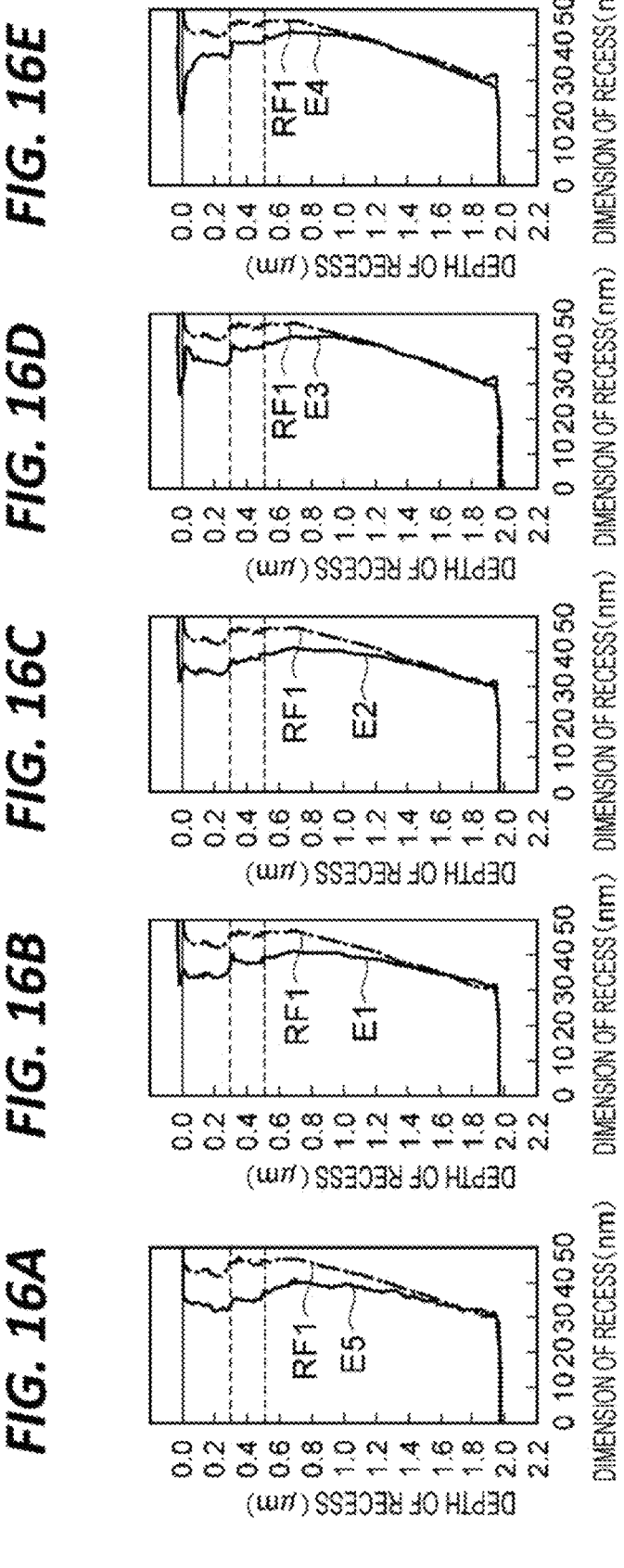
FIGS. 16A to 16E are graphs representing examples of dimensions and depths of recesses before and after a protective film is formed in first to fifth experiments.

FIGS. 16A to 16E are graphs representing examples of dimensions and depths of recesses before and after a protective film is formed in the first to fifth experiments. FIG. 16A illustrates the graph of the fifth experiment. FIG. 16B illustrates the graph of the first experiment. FIG. 16C illustrates the graph of the second experiment. FIG. 16D illustrates the graph of the third experiment. FIG. 16E illustrates the graph of the fourth experiment. In each graph, the vertical axis represents the depth of the recess RS. The depth range of 0 μm to 0.3 μm corresponds to the mask MK. The depth range of 0.3 μm to 0.5 μm corresponds to the SiN film. The depth range of 0.5 μm to 2.0 μm corresponds to the $SiO_2$ film. The horizontal axis represents the dimension of the recess RS (critical dimension (CD)). The depth and the dimension of the recess RS may be calculated from an SEM image. In each graph, the dot-and-dash line RF1 indicates the dimension of the recess RS before the protective film PR is formed. The solid lines E1 to E5 indicate the dimensions of the recesses RS after the protective film PR is formed in the first to fifth experiments, respectively. From each graph, it may be seen that the dimension of the recess RS decreases due to the protective film PR.

As illustrated in FIGS. 16A to 16C, the thickness of the protective film PR in the first and second experiments is substantially the same as that in the fifth experiment. Meanwhile, as illustrated in FIG. 16D, the thickness of the protective film PR in the third experiment is smaller than that in the fifth experiment. As illustrated in FIG. 16E, the thickness of the protective film PR in the fourth experiment is smaller than that in the third experiment. It is assumed that the thickness of the protective film PR decreases because the opening OP1 of the mask MK becomes narrow due to the deposit DP making it difficult to form the protective film PR in the recess RS. However, in the second experiment, the thickness of the protective film PR does not decrease. This is presumably because the thickness of the deposit DP is small, and thus, the opening OP1 of the mask MK is difficult to narrow.
(Remaining Thickness of Mask)

Figure 17:
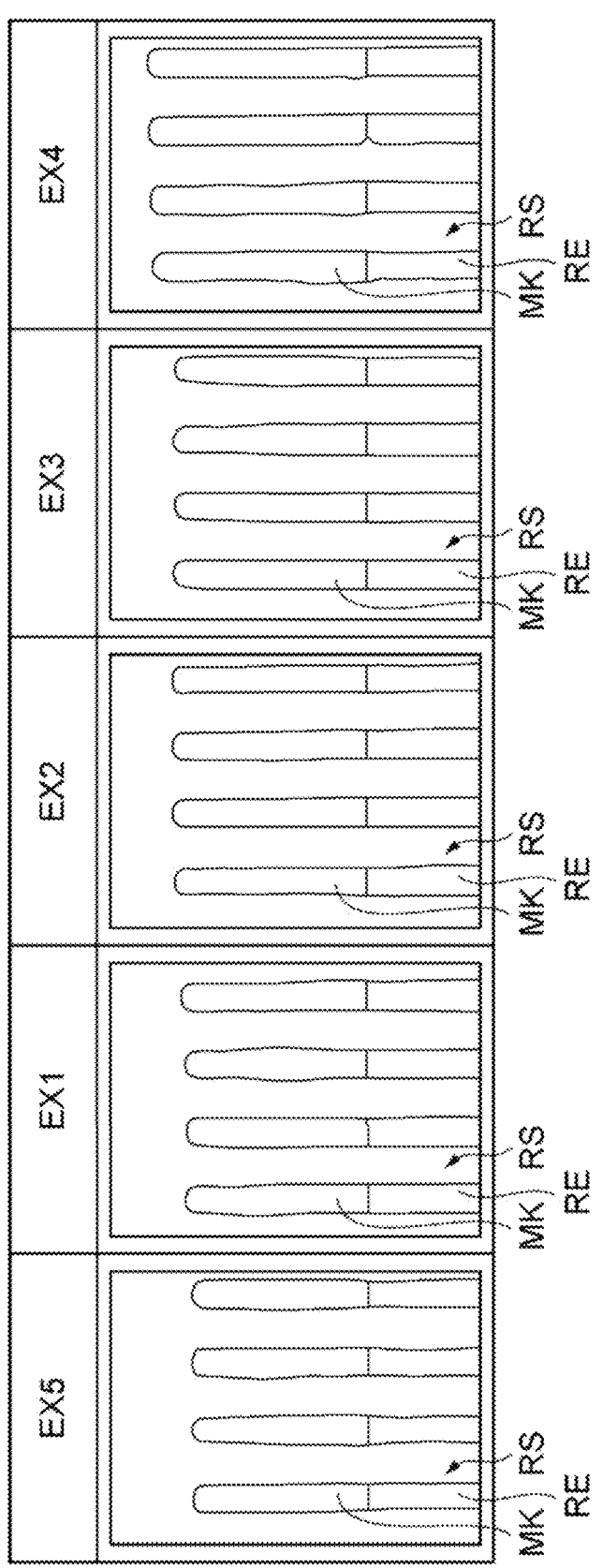
FIG. 17 is a view illustrating an example of the cross section of a substrate after an etching is performed in first to fifth experiments.

FIG. 17 is a view illustrating an example of the cross section of the substrate after the etching is performed in each of the first through fifth experiments EX1 to EX5. EX1 to EX5 represent examples of the cross sections of the substrates after the etching is performed in the first to fifth experiments, respectively. In the fifth experiment, the remaining thickness of the mask MK is 208 nm. In the first experiment, the remaining thickness of the mask MK is 218 nm. In the second experiment, the remaining thickness of the mask MK is 231 nm. In the third experiment, the remaining thickness of the mask MK is 230 nm. In the fourth experiment, the remaining thickness of the mask MK is 263 nm.

In the first experiment, the remaining thickness of the mask MK is larger than that in the fifth experiment. In the second and third experiment, the remaining thickness of the mask MK is larger than that in the first experiment. In the fourth experiment, the remaining thickness of the mask MK is larger than that in the second and third experiments. The larger the remaining thickness of the mask MK, the higher the etching selectivity with respect to the mask MK.

(Dimension and Depth of Recess)

Figure 18:
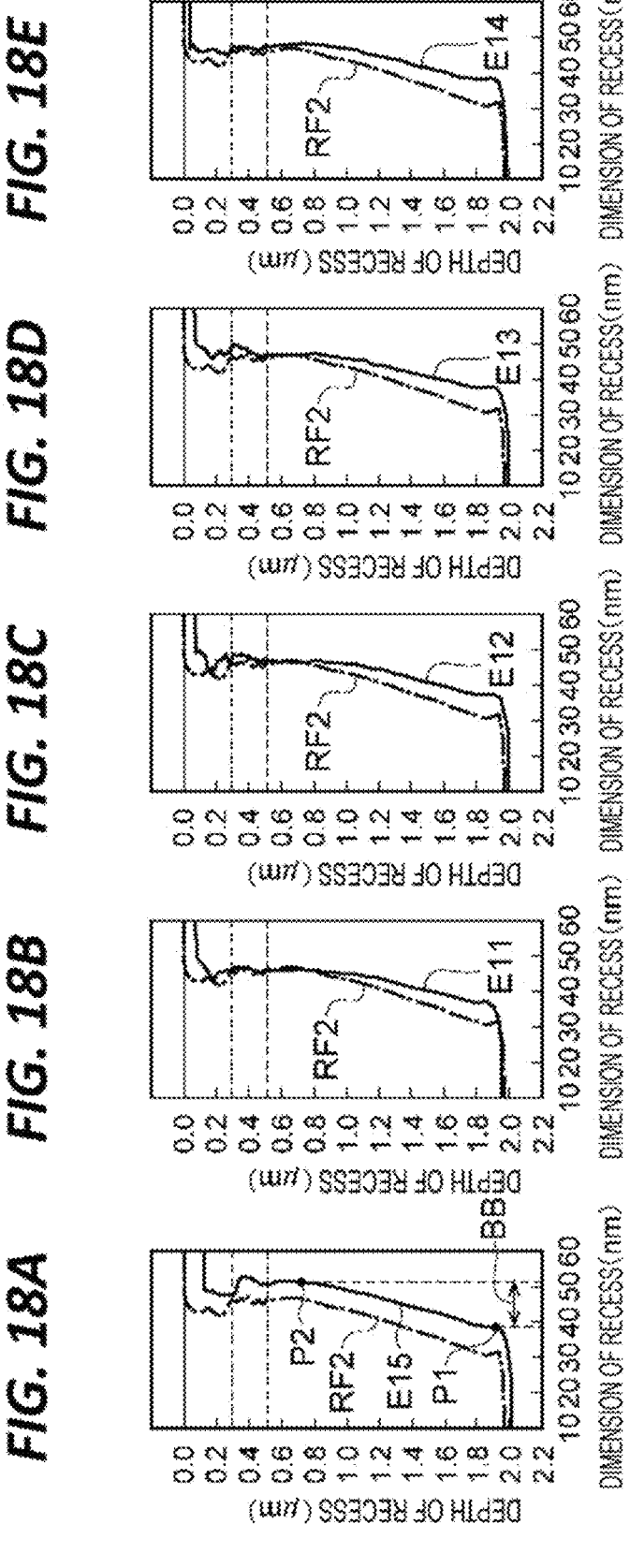
FIGS. 18A to 18E are graphs illustrating examples of dimensions and depths of recesses before and after an etching is performed in first to fifth experiments.

FIGS. 18A to 18E are graphs illustrating examples of the dimensions and the depths of the recesses before and after the etching is performed in the first to fifth experiments. FIG. 18A illustrates the graph of the fifth experiment. FIG. 18B illustrates the graph of the first experiment. FIG. 18C illustrates the graph of the second experiment. FIG. 18D illustrates the graph of the third experiment. FIG. 18E illustrates the graph of the fourth experiment. In each graph, the vertical axis represents the depth of the recess RS. The depth range of 0 μm to 0.3 μm corresponds to the mask MK. The depth range of 0.3 μm to 0.5 μm corresponds to the SiN film. The depth range of 0.5 μm to 2.0 μm corresponds to the $SiO_2$ film. The horizontal axis represents the dimension of the recess RS. In each graph, the dot-and-dash line RF2 indicates the dimension of the recess RS before the etching is performed. The solid lines E11 to E15 indicate the dimensions of the recesses RS after the etching is performed in the first to fifth experiments, respectively. From each graph, it may be seen that the dimension of the recess RS increases by the etching.

As illustrated in FIG. 18A, in the fifth experiment, the difference BB between the dimension of the recess RS of the maximal point P1 at the deep location and the dimension of the recess RS of the maximal point P2 at the shallow location is 13 nm after the etching is performed. The larger the difference BB, the greater the degree of bowing. The difference BB may be calculated in the same way for the first to fourth experiments. In the first to fourth experiments, the differences BB after the etching is performed are 9.3 nm, 9.9 nm, 9.6 nm, and 10.0 nm, respectively. Thus, it may be seen that the degree of bowing in the first to fourth experiments is smaller than that in the fifth experiment after the etching is performed.

(Etching Rate)

Figure 19:
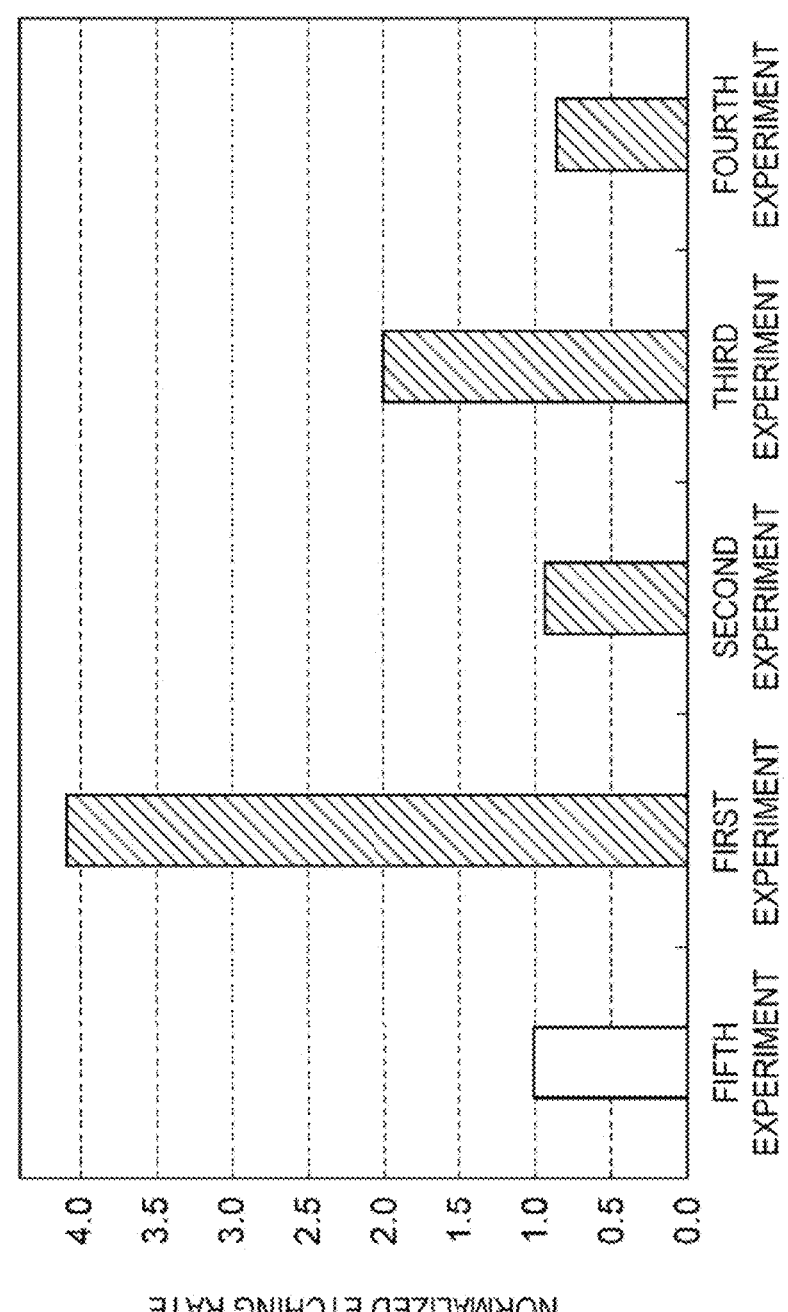
FIG. 19 is a graph illustrating examples of normalized etching rates in first to fifth experiments.

FIG. 19 is a graph illustrating examples of normalized etching rates in the first to fifth experiments. In the graph, the vertical axis represents the etching rate normalized by setting the etching rate of the mask MK to 1 in the fifth experiment. The etching rate in each of the first to fourth experiments is calculated by dividing the total etching amount of the deposit DP and the mask MK by the etching time. From the graph, it may be seen that the etching resistance of the deposit DP in the fourth experiment is higher than that of the deposit DP in the second experiment. It may be seen that the etching resistance of the deposit DP in the second experiment is higher than that of the deposit DP in the third experiment. It may be seen that the etching resistance of the deposit DP in the third experiment is higher than that of the deposit DP in the first experiment.

While the various embodiments have been described, various additions, omissions, substitutions, and modifications may be made without being limited to the embodiments described above. Further, elements in different embodiments may be combined with each other to form other embodiments.

The various embodiments included in the present disclosure are described in (E1) to (E50) below.

(E1) A substrate processing method including:

(a) preparing a substrate, the substrate including a first region and a second region formed on the first region and providing an opening on the first region;

(b) forming a top deposit on a top of the second region, by using a plasma generated from a gas;

(c) forming a first film on a surface of the top deposit and a sidewall surface defining the opening, the first film has a thickness decreasing along a depth direction of the opening; and (d) after (c), adsorbing a precursor onto the substrate to modify the precursor on the substrate, thereby forming a second film on the substrate, wherein the first region is a silicon-containing film and the top deposit contains carbon, boron, or a metal, or the first region is an organic film and the top deposit contains boron or a metal.

(E2) The substrate processing method described in (E1), further including: (e) after (d), etching the first region.

(E3) The substrate processing method described in (E2), wherein in the etching the first region in (e), the top deposit is formed of a material having a lower etching rate than that of a material of the second region.

(E4) The substrate processing method described in any one of (E1) to (E3), wherein in (c), the first film is formed to improve a verticality of the sidewall surface defining the opening in the substrate after the first film is formed.

(E5) The substrate processing method described in any one of (E1) to (E4), wherein in (b), the top deposit is formed by a plasma CVD method.

(E6) The substrate processing method described in any one of (E1) to (E5), wherein in (c), the first film is formed by an unsaturated ALD method.

(E7) The substrate processing method described in any one of (E1) to (E6), wherein the first film is a silicon oxide film or a carbon-containing film.

(E8) The substrate processing method described in any one of (E1) to (E7), wherein the second film is a tungsten-containing film, a tin-containing film, an aluminum-containing film, or a hafnium-containing film.

(E9) The substrate processing method described in any one of (E1) to (E8), wherein the second region is a polycrystalline silicon film, an organic film, or a resist film.

(E10) The substrate processing method described in (E1) to (E9), wherein the first region is a silicon film, a silicon oxide film, a silicon nitride film, a stacked film including a silicon oxide film and a silicon nitride film, or an amorphous carbon film.

(E11) A plasma processing apparatus including:

a chamber;

a substrate support provided in the chamber;

a gas supply that supplies a gas into the chamber;

a plasma generator that generates a plasma from the gas in the chamber; and a controller that controls the gas supply and the plasma generator, wherein the controller controls the gas supply and the plasma generator to perform a process including:

(a) preparing a substrate, the substrate including a first region and a second region formed on the first region and providing an opening on the first region, (b) forming a top deposit on a top of the second region, by using a first plasma generated from a first gas, (c) forming a first film on a surface of the top deposit and a sidewall surface defining the opening, in which a thickness of the first film decreases along a depth direction of the opening, and (d) after (c), adsorbing a precursor onto the substrate to modify the precursor on the substrate, thereby forming a second film on the substrate, wherein the first region is a silicon-containing film and the top deposit contains carbon, boron, or a metal, or the first region is a carbon-containing film and the top deposit contains boron or a metal.

(E12) The plasma processing apparatus described in (E11), wherein the controller controls the gas supply and the plasma generator to perform the process further including:

(e) after (d), etching the first region.

(E13) A substrate processing system comprising:

a plurality of process modules;

a transfer module connected to each of the plurality of process modules and including a pressure reducible chamber and a transfer device that is provided in the chamber and transfers a substrate; and a controller that controls the plurality of process modules and the transfer module, wherein the controller controls the plurality of process modules and the transfer module to perform a process including:

(a) preparing a substrate, the substrate including a first region and a second region formed on the first region and providing an opening on the first region, (b) forming a top deposit on a top of the second region, by using a first plasma generated from a first gas, (c) forming a first film on a surface of the top deposit and a sidewall surface defining the opening, the first film having a thickness decreasing along a depth direction of the opening, and (d) after (c), adsorbing a precursor onto the substrate to modify the precursor on the substrate, thereby forming a second film on the substrate, wherein the first region is a silicon-containing film and the top deposit contains carbon, boron, or a metal, or the first region is a carbon-containing film and the top deposit contains boron or a metal.

(E14) The substrate processing system described in (E13), wherein the controller controls at least one of the plurality of process modules and the transfer module to perform the process further including:

after (d), etching the first region.

(E15) An etching method comprising:

(a) providing a substrate having an etching target film and a mask on the etching target film;

(b) after (a), etching the etching target film, by a first plasma generated from a first processing gas, to form a recess;

(c) after (b), forming a deposit on a top surface of the mask by a second plasma generated from a second processing gas;

(d) after (b), forming a protective film on a sidewall of the recess; and (e) after (c) and (d), etching the recess by a third plasma generated from a third processing gas.

According to the etching method (E1)] above, the mask is protected by the deposit formed on the top surface of the mask, when the recess is etched. Thus, a high etching selectivity with respect to the mask may be achieved when the recess is etched.

(E16) The etching method described in (E15), further including:

(f) after (b), removing a substance adhered to the mask in (b), by a fourth plasma generated from a fourth processing gas.

In this case, the deposit may be formed on the top surface of the mask in the state where the adhered substance is removed.

(E17) The etching method described in (E15) or (E16), wherein the deposit includes at least one of silicon, carbon, boron, and a metal.

(E18) The etching method described in any one of (E15) to (E17), wherein the etching target film includes a silicon-containing film, and the mask includes at least one of a second silicon-containing material different from a first silicon-containing material that makes up the silicon-containing film, an organic material, and a metal.

(E19) The etching method described in any one of (E15) to (E17), wherein the etching target film includes an organic film, and the mask includes at least one of a silicon-containing material, a second organic material different from a first organic material that makes up the organic film, and a metal.

(E20) The etching method described in any one of (E15) to (E19), further including repeating (c) to (e), after (e).

In this case, the etching amount of the recess may be increased.

(E21) The etching method described in any one of (E15) to (E20), wherein the deposit includes a first deposit formed on the top surface of the mask and a second deposit formed on the first deposit, and the second deposit includes a different material from that of the first deposit.

In this case, an appropriate combination of the material of the first deposit and the material of the second deposit may be selected in consideration of the materials of the etching target film and the mask.

(E22) The etching method described in any one of (E15) to (E21), wherein the etching target film includes a silicon-containing film, and the first processing gas includes a halogen-containing gas.

(E23) The etching method described in any one of (E15) to (E21), wherein the etching target film includes an organic film, and the first processing gas includes an oxygen-containing gas.

(E24) The etching method described in any one of (E15) to (E23), wherein the second processing gas includes at least one of a silicon-containing gas, a carbon-containing gas, a boron-containing gas, and a metal-containing gas.

(E25) The etching method described in any one of (E15) to (E24), wherein the protective film is formed on the top surface of the deposit.

In this case, the deposit and the mask are protected by the protective film. Therefore, an even higher etching selectivity with respect to the mask may be achieved when the recess is etched.

(E26) The etching method described in (E25), wherein the protective film has a first thickness at the top surface of the deposit and a second thickness at the sidewall of the recess, and the second thickness is smaller than the first thickness.

In this case, the clogging of the recess may be suppressed while protecting the deposit and the mask by the protective film.

(E27) The etching method described in any one of (E15) to (E26), wherein the protective film is formed by an ALD or CVD method.

(E28) The etching method described in any one of (E15) to (E27), wherein the protective film includes at least one of a silicon-containing film, an organic film, and a metal-containing film.

(E29) The etching method described in any one of (E15) to (E28), wherein the protective film includes the same material as that of the deposit.

(E30) The etching method described in any one of (E15) to (E28), wherein the protective film includes a material different from that of the deposit.

(E31) The etching method described in any one of (E15) to (E30), wherein the protective film is formed using a fifth processing gas, and the fifth processing gas includes at least one of a silicon-containing gas, a carbon-containing gas, and a metal-containing gas.

(E32) The etching method described in any one of (E15) to (E31), wherein the etching target film includes a silicon-containing film, and the third processing gas includes a halogen-containing gas.

(E33) The etching method described in any one of (E15) to (E31), wherein the etching target film includes an organic film, and the third processing gas includes an oxygen-containing gas.

(E34) A plasma processing apparatus including:

a chamber;

a substrate support that supports a substrate in the chamber, the substrate having an etching target film and a mask on the etching target film, a gas supply that supplies a first processing gas, a second processing gas, and a third processing gas into the chamber;

a plasma generator that generates a first plasma, a second plasma, and a third plasma from the first processing gas, the second processing gas, and the third processing gas, respectively, in the chamber; and a controller, wherein the controller controls the gas supply and the plasma generator to perform a process including etching the etch target film with the first plasma to form a recess, after forming the recess, forming a deposit on a top surface of the mask with the second plasma, after forming the recess, forming a protective film on the sidewall of the recess, and after forming the deposit and the protective film, etching the recess by the third plasma.

According to the plasma processing apparatus (E34), the mask is protected by the deposit formed on the top surface of the mask, when etching the recess. Thus, when etching the recess, a high etching selectivity with respect to the mask may be achieved.

(E35) The plasma processing apparatus described in (E34), further including an optical observation device that measures a dimension of the recess.

(E36) A substrate processing method including:

(a) preparing a substrate, the substrate including a first region and a second region formed on the first region and providing an opening on the first region;

(b) forming a top deposit on a top of the second region, by using a plasma generated from a gas; and (c) forming a first film on a surface of the top deposit and a sidewall surface defining the opening, the first film having a thickness decreasing along a depth direction of the opening.

(E37) The substrate processing method described in (E36), further including:

(d) after (c), adsorbing a precursor onto the substrate to modify the precursor on the substrate, thereby forming a second film on the substrate, wherein the first region is a silicon-containing film and the top deposit contains carbon, boron, or a metal, or the first region is an organic film and the top deposit contains boron or a metal.

(E38) The substrate processing method described in (E37), further including:

(e) after (d), etching the first region.

(E39) The substrate processing method described in (E38), wherein in the etching the first region in (e), the top deposit is formed of a material having a lower etching rate than that of a material of the second region.

(E40) The substrate processing method described in any one of (E37) to (E39), wherein the second film is a tungsten-containing film, a tin-containing film, an aluminum-containing film, or a hafnium-containing film.

(E41) The substrate processing method described in any one of (E36) to (E40), wherein in (c), the first film is formed to improve a verticality of the sidewall surface defining the opening in the substrate after the first film is formed.

(E42) The substrate processing method described in any one of (E36) to (E41), wherein in (a), the first region is an underlying film, the second region includes an etching target film on the underlying film and a mask on the etching target film, the opening includes a first opening in the mask and a second opening in the etching target film, and (a) includes etching the etching target film through the first opening, thereby forming the second opening.

(E43) The substrate processing method described in (E42), further including:

(d) after (c), etching the sidewall surface defining the second opening.

(E44) The substrate processing method described in any one of (E36) to (E43), wherein in (b), the top deposit is formed by a plasma CVD method.

(E45) The substrate processing method described in any one of (E36) to (E44), wherein in (c), the first film is formed by an unsaturated ALD or CVD method.

(E46) The substrate processing method described in any one of (E36) to (E45), wherein the first film is a silicon oxide film, a carbon-containing film, or a metal-containing film.

(E47) The substrate processing method described in any one of (E36) to (E46), wherein the second region is a polycrystalline silicon film, an organic film, or a resist film.

(E48) The substrate processing method described in any one of (E36) to (E47), wherein the first region is a silicon film, a silicon oxide film, a silicon nitride film, a stacked film including a silicon oxide film and a silicon nitride film, or an amorphous carbon film.

(E49) The substrate processing method described in any one of (E36) to (E48), wherein the top deposit includes at least one of silicon, carbon, boron, and a metal.

(E50) A plasma processing apparatus including:

a chamber;

a substrate support provided in the chamber;

a gas supply that supplies a gas into the chamber;

a plasma generator that generates a plasma from the gas in the chamber; and a controller that controls the gas supply and the plasma generator, wherein the controller controls the gas supply and the plasma generator to perform a process including:

(a) preparing a substrate, the substrate including a first region and a second region formed on the first region and providing an opening on the first region, (b) forming a top deposit on a top of the second region, by using a first plasma generated from a first gas, and (c) forming a first film on a surface of the top deposit and a sidewall surface defining the opening, the first film having a thickness decreasing along a depth direction of the opening.

According to an embodiment, it is possible to adjust the shape of a region providing an opening in a substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing method comprising:

(a) preparing a substrate including a first region and a second region formed on the first region, the second region providing an opening on the first region;

(b) forming a top deposit on a top of the second region, by using a plasma generated from a gas;

(c) forming a first film on a surface of the top deposit and a sidewall surface defining the opening, the first film having a thickness decreasing along a depth direction of the opening; and (d) after (c), adsorbing a precursor onto the substrate and modifying the precursor on the substrate, thereby forming a second film on the substrate.

2. The substrate processing method according to claim 1, wherein the first region is a silicon-containing film and the top deposit contains carbon, boron, or a metal, or the first region is an organic film and the top deposit contains boron or a metal.

3. The substrate processing method according to claim 2, further comprising:

(e) after (d), etching the first region.

4. The substrate processing method according to claim 3, wherein in the etching the first region in (e), the top deposit is formed of a material having an etching rate lower than that of a material of the second region.

5. The substrate processing method according to claim 2, wherein the second film is a tungsten-containing film, a tin-containing film, an aluminum-containing film, or a hafnium-containing film.

6. The substrate processing method according to claim 1, wherein the sidewall surface of the opening has a width that decreases along its depth direction and is inclined with respect to a vertical direction.

7. The substrate processing method according to claim 1, wherein in (b), the top deposit is formed by a plasma CVD method.

8. The substrate processing method according to claim 1, wherein in (c), the first film is formed by an unsaturated ALD or CVD method.

9. The substrate processing method according to claim 1, wherein the first film is a silicon oxide film, a carbon-containing film, or a metal-containing film.

10. The substrate processing method according to claim 1, wherein the second region is a polycrystalline silicon film, an organic film, or a resist film.

11. The substrate processing method according to claim 1, wherein the first region is a silicon film, a silicon oxide film, a silicon nitride film, a stacked film including a silicon oxide film and a silicon nitride film, or an amorphous carbon film.

12. The substrate processing method according to claim 1, wherein the top deposit includes at least one of silicon, carbon, boron, and a metal.

* * * * *